United States Patent
Hirade et al.

(10) Patent No.: US 12,058,877 B2
(45) Date of Patent: Aug. 6, 2024

(54) IMAGING APPARATUS INCLUDING ORGANIC PHOTOELECTRIC CONVERSION LAYER AND HOLE BLOCKING LAYER

(71) Applicant: Panasonic Intellectual Property Management Co., Ltd., Osaka (JP)

(72) Inventors: Masaya Hirade, Osaka (JP); Hiroaki Iijima, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 431 days.

(21) Appl. No.: 17/386,009

(22) Filed: Jul. 27, 2021

(65) Prior Publication Data

US 2021/0359005 A1 Nov. 18, 2021

Related U.S. Application Data

(63) Continuation of application No. PCT/JP2020/000415, filed on Jan. 9, 2020.

(30) Foreign Application Priority Data

Feb. 8, 2019 (JP) ................................. 2019-021227

(51) Int. Cl.
*H10K 30/30* (2023.01)
*H10K 39/32* (2023.01)
*H10K 85/20* (2023.01)

(52) U.S. Cl.
CPC ........... *H10K 39/32* (2023.02); *H10K 30/353* (2023.02); *H10K 85/211* (2023.02)

(58) Field of Classification Search
CPC .............................. H10K 30/353; H10K 39/32
USPC ....................................................... 257/431
See application file for complete search history.

(56) References Cited

U.S. PATENT DOCUMENTS

2007/0063156 A1 3/2007 Hayashi
2010/0089452 A1 4/2010 Suzuki et al.
(Continued)

FOREIGN PATENT DOCUMENTS

EP 3579021 B1 * 3/2021 ............... G01C 3/08
JP 2007-088033 4/2007
(Continued)

OTHER PUBLICATIONS

The Extended European Search Report dated Mar. 7, 2022 for the related European Patent Application No. 20752065.1.
(Continued)

*Primary Examiner* — Hoai V Pham
(74) *Attorney, Agent, or Firm* — Rimon P.C.

(57) ABSTRACT

An imaging apparatus includes a semiconductor substrate; a first electrode; a second electrode; a photoelectric conversion layer disposed between the first electrode and the second electrode, and including a donor organic semiconductor material and an acceptor organic semiconductor material; a charge accumulation node positioned within the semiconductor substrate and electrically connected to the second electrode; and a first blocking layer disposed between the first electrode and the photoelectric conversion layer. The photoelectric conversion layer has an ionization potential of lower than or equal to 5.3 eV. The first blocking layer has an electron affinity lower than an electron affinity of the acceptor organic semiconductor material included in the photoelectric conversion layer. The imaging apparatus has spectral sensitivity in a near-infrared light region having wavelengths of greater than or equal to 650 nm and less than or equal to 3000 nm.

18 Claims, 10 Drawing Sheets

(56) References Cited

U.S. PATENT DOCUMENTS

| | | |
|---|---|---|
| 2010/0283039 A1 | 11/2010 | Meng et al. |
| 2013/0015435 A1 | 1/2013 | Sawaki et al. |
| 2018/0219047 A1 | 8/2018 | Tokuhara et al. |
| 2018/0294316 A1 | 10/2018 | Tokuhara et al. |

FOREIGN PATENT DOCUMENTS

| | | |
|---|---|---|
| JP | 2010-183060 | 8/2010 |
| JP | 2010-263175 | 11/2010 |
| JP | 2011-222949 A | 11/2011 |
| JP | 2013-032493 | 2/2013 |
| JP | 2014-022525 | 2/2014 |
| JP | 2015-026703 | 2/2015 |
| JP | 2017-005249 | 1/2017 |
| JP | 2018-182314 | 11/2018 |
| WO | 2010/120393 A2 | 10/2010 |
| WO | 2016/194337 | 12/2016 |

OTHER PUBLICATIONS

International Search Report of PCT application No. PCT/JP2020/000415 dated Mar. 10, 2020.

Jana Zaumseil et al., "Electron and Ambipolar Transport in Organic Field-Effect Transistors", Chemical Reviews, American Chemical Society, vol. 107, No. 4, Mar. 23, 2007, pp. 1296-1323.

Serap Gunes et al., "Conjugated Polymer-Based Organic Solar Cells", Chemical Reviews, American Chemical Society, vol. 107, No. 4, Apr. 11, 2007, pp. 1324-1338.

Xilan Liu et al., "Solution-processed near-infrared polymer photodetectors with an inverted device structure", Organic Electronics, vol. 13, Sep. 6, 2012, pp. 2929-2934.

The EPC Office Action dated Jan. 23, 2024 for the related European Patent Application No. 20752065.1.

Pandey Richa et al: "Tin naphthalocyanine complexes for infrared absorption in organic photovoltaic cells", Organic Electronics, Elsevier, Amsterdam, NL, vol. 14, No. 3, Jan. 16, 2013 (Jan. 16, 2013), pp. 804-808, XP029002214.

Djurovich Pi e t al: "Measurement of the lowest unoccupied molecular orbtial energies of molecular organics semiconductors", Organic Electronics, Elsevier, Amsterdam, NL, .vlo 10, No. 3, May 1, 2009 (May 1, 2009), pp. 515-520, XP026029294.

Francesco Arca et al., "Near-Infrared Organic Photodiodes", IEEE Journal of Quantum Electronics, 2013, vol. 49, p. 1016-1025.

* cited by examiner

IMAGING APPARATUS INCLUDING ORGANIC PHOTOELECTRIC CONVERSION LAYER AND HOLE BLOCKING LAYER

BACKGROUND

1. Technical Field

The present disclosure relates to an imaging apparatus.

2. Description of the Related Art

Organic semiconductor materials have properties, functions, and the like that existing inorganic semiconductor materials such as silicon do not have. Thus, as disclosed in JANA ZAUMSEIL et. al., "Electron and Ambipolar Transport in Organic Field-Effect Transistors", Chemical Reviews, American Chemical Society, 2007, Vol. 107, No. 4, pp. 1296-1323, organic semiconductor materials have been intensively studied in these years as semiconductor materials that can provide novel semiconductor devices and electronic devices.

For example, it has been studied that an organic semiconductor material is used to form a thin film serving as a photoelectric conversion material, to thereby provide a photoelectric conversion device. As disclosed in SERAP GUNES et. al., "Conjugated Polymer-Based Organic Solar Cells", Chemical Reviews, American Chemical Society, 2007, Vol. 107, No. 4, pp. 1324-1338, a photoelectric conversion device that uses an organic-material thin film and extracts, as energy, generated charges (namely, carriers) due to light can be used as an organic thin-film solar cell. Alternatively, as disclosed in Japanese Patent No. 4677314, Japanese Patent No. 5349156, and Japanese Patent No. 5969843, such a photoelectric conversion device that extracts, as electrical signals, generated charges due to light can be used as an optical sensor such as an imaging device.

SUMMARY

In one general aspect, the techniques disclosed here feature an imaging apparatus including a semiconductor substrate; a first electrode; a second electrode; a photoelectric conversion layer disposed between the first electrode and the second electrode, and including a donor organic semiconductor material and an acceptor organic semiconductor material; a charge accumulation node positioned within the semiconductor substrate and electrically connected to the second electrode; and a first blocking layer disposed between the first electrode and the photoelectric conversion layer. The photoelectric conversion layer has an ionization potential of lower than or equal to 5.3 eV. The first blocking layer has an electron affinity lower than an electron affinity of the acceptor organic semiconductor material included in the photoelectric conversion layer. The imaging apparatus has spectral sensitivity in a near-infrared light region having wavelengths of greater than or equal to 650 nm and less than or equal to 3000 nm.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
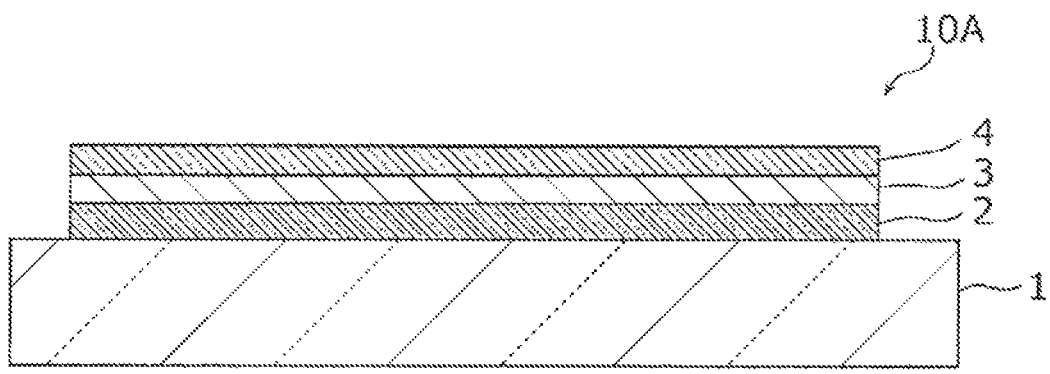
FIG. 1 is a schematic sectional view illustrating an example of a photoelectric conversion device not including a hole-blocking layer or an electron-blocking layer.

Underlying Knowledge Forming Basis of the Present Disclosure

In organic semiconductor materials, changes in the molecular structures of the organic compounds employed can result in changes in the energy levels. Thus, for example, when an organic semiconductor material is used as a photoelectric conversion material, its absorption wavelengths can be controlled, so that the material can be made to have spectral sensitivity in the near-infrared light region, where silicon (Si) does not have spectral sensitivity. Specifically, use of organic semiconductor materials enables utilization of light in the wavelength region that has not been used for photoelectric conversion, to achieve an increase in the efficiency of solar cells and optical sensors and the like for the near-infrared light region. Thus, in these years, organic semiconductor materials, photoelectric conversion devices, and imaging devices that have spectral sensitivity in the near-infrared light region have been intensively studied. Hereafter, photoelectric conversion devices using organic semiconductor materials may be referred to as "organic photoelectric conversion devices".

In order to increase the spectral sensitivity in the near-infrared light region, it is effective to narrow the band gap of electron excitation of the organic semiconductor material. On the other hand, in order to increase the S/N ratio of the photoelectric conversion device, in addition to increase in the photoelectric conversion efficiency, reduction in the dark current is necessary.

In an organic photoelectric conversion device, dark current is generated by injection of charges from the outer electrodes and generation of charges within the photoelectric conversion layer. In the case of using, as the photoelectric conversion layer, a photoelectric conversion layer having a bulk hetero structure formed of a blend film of a donor organic semiconductor material and an acceptor organic semiconductor material, the donor organic semiconductor material and the cathode are in contact with each other, so that injection of charges from the cathode tends to occur, and dark current derived from injection of charges from the outer electrode tends to be generated. In particular, in the case of a material used for a photoelectric conversion layer for the near-infrared light region, in order to make the absorption wavelengths longer, the band gap is narrowed, which results in a relatively low ionization potential; thus, the barrier of injection of charges from the cathode lowers, which promotes injection of charges. Thus, a hole-blocking layer having a relatively high ionization potential can be disposed between the photoelectric conversion layer and the cathode, to thereby suppress the dark current. However, as described above, the dark current can also be generated due to generation of charges within the photoelectric conversion layer. In particular, in the case of using the hole-blocking layer, because of generation of charges at the interface between the photoelectric conversion layer and the hole-blocking layer, the dark current is generated, so that the dark current cannot be sufficiently suppressed in some cases. The generation of charges at the interface between the photoelectric conversion layer and the hole-blocking layer is affected by the ionization potential and the electron affinity of materials used for the photoelectric conversion layer and the hole-blocking layer.

The present inventors have found that, in a photoelectric conversion device having spectral sensitivity in the near-infrared light region, the ionization potential of the photoelectric conversion layer and the electron affinity of the photoelectric conversion layer and the hole-blocking layer can be controlled so as to suppress the dark current.

Thus, in the present disclosure, the ionization potential of the donor organic semiconductor material and the electron affinity of the acceptor organic semiconductor material and the hole-blocking layer are controlled so as to provide an imaging apparatus and the like that have spectral sensitivity in the near-infrared light region and that enable reduction in the dark current.

The summary of an aspect according to the present disclosure is as follows.

An imaging apparatus according to an aspect of the present disclosure includes a semiconductor substrate; a first electrode; a second electrode; a photoelectric conversion layer disposed between the first electrode and the second electrode, and including a donor organic semiconductor material and an acceptor organic semiconductor material; a charge accumulation node positioned within the semiconductor substrate and electrically connected to the second electrode; and a first blocking layer disposed between the first electrode and the photoelectric conversion layer. The photoelectric conversion layer has an ionization potential of lower than or equal to 5.3 eV. The first blocking layer has an electron affinity lower than an electron affinity of the acceptor organic semiconductor material included in the photoelectric conversion layer. The imaging apparatus has spectral sensitivity in a near-infrared light region having wavelengths of greater than or equal to 650 nm and less than or equal to 3000 nm.

Note that, in this specification, "near-infrared light region" is a wavelength region having optical wavelengths of greater than or equal to 650 nm and less than or equal to 3000 nm.

In addition, in this specification, "an imaging apparatus or a photoelectric conversion device 'has spectral sensitivity' in wavelengths" means that, in the wavelengths, the imaging apparatus or the photoelectric conversion device has an external quantum efficiency of greater than or equal to 1%.

Thus, when the imaging apparatus according to an aspect of the present disclosure is used, the imaging apparatus has spectral sensitivity in the near-infrared light region, but the first blocking layer has an electron affinity lower than the electron affinity of the acceptor organic semiconductor material included in the photoelectric conversion layer, which suppresses electron excitation at the interface between the photoelectric conversion layer and the first blocking layer. This provides an imaging apparatus that has spectral sensitivity in the near-infrared light region and that enables reduction in the dark current.

In addition, for example, an absorption wavelength of the photoelectric conversion layer may have a local maximum in the near-infrared light region.

In this case, since the photoelectric conversion layer has a local maximum-absorption wavelength in the near-infrared light region, higher spectral sensitivity for the near-infrared light region is provided.

In addition, for example, the photoelectric conversion layer may include, as the acceptor organic semiconductor material, at least one selected from the group consisting of fullerene and a fullerene derivative.

In this case, electron transfer smoothly occurs between the donor organic semiconductor material and the acceptor organic semiconductor material, to thereby achieve a higher photoelectric conversion efficiency.

In addition, for example, the acceptor organic semiconductor material may include a soluble fullerene derivative.

In this case, the acceptor organic semiconductor material is soluble in solvents, which enables production by a printing process.

In addition, for example, the acceptor organic semiconductor material may be the same as a material of the first blocking layer.

In addition, for example, the electron affinity of the first blocking layer may be lower than a work function of the first electrode.

In addition, for example, the first blocking layer may have an ionization potential lower than an ionization potential of the acceptor organic semiconductor material included in the photoelectric conversion layer.

In addition, for example, the imaging apparatus may further include a second blocking layer disposed between the second electrode and the photoelectric conversion layer.

In addition, for example, the second blocking layer may have an electron affinity lower than an electron affinity of the donor organic semiconductor material included in the photoelectric conversion layer.

In addition, for example, the second blocking layer may have an ionization potential higher than an ionization potential of the donor organic semiconductor material included in the photoelectric conversion layer.

In addition, for example, the second blocking layer may have an electron affinity lower than a work function of the second electrode.

Hereinafter, embodiments according to the present disclosure will be specifically described with reference to drawings.

Note that the following embodiments are all comprehensive or specific examples. In the following embodiments, values, shapes, elements, positions and connection forms of elements, steps, the order of steps, and the like are mere examples, and are not intended to limit the present disclosure. Of the elements in the following embodiments, elements that are not described in independent claims defining the most generic concepts will be described as optional elements. The drawings are not necessarily drawn exactly. In the drawings, substantially the same elements may be denoted by the same reference signs, and repeated descriptions thereof may be omitted or simplified.

EMBODIMENTS

Hereinafter, embodiments will be described.
Photoelectric Conversion Device

Hereinafter, a photoelectric conversion device according to an embodiment will be described with reference to FIG. 1 and FIG. 2. The photoelectric conversion device according to the embodiment is, for example, a charge-read-out-mode photoelectric conversion device. FIG. 1 is a schematic sectional view of a photoelectric conversion device 10A used for describing the photoelectric conversion device according to the embodiment. The photoelectric conversion device 10A does not include a hole-blocking layer 6 or an electron-blocking layer 5 described later; first, in the photoelectric conversion device according to the embodiment, a lower electrode 2 serving as a first electrode, an upper electrode 4 serving as a second electrode, and a photoelectric conversion layer 3 will be described.

The photoelectric conversion device 10A includes the upper electrode 4 serving as the first electrode, the lower electrode 2 serving as the second electrode, and the photoelectric conversion layer 3 disposed between the first electrode and the second electrode. The photoelectric conversion layer 3 is a blend film having a bulk hetero structure in which a donor organic semiconductor material and an acceptor organic semiconductor material are blended.

As illustrated in FIG. 1, the photoelectric conversion device 10A includes the lower electrode 2, the upper electrode 4, and the photoelectric conversion layer 3 disposed between the lower electrode 2 and the upper electrode 4. The photoelectric conversion device 10A includes the photoelectric conversion layer 3 having absorption in the near-infrared light region.

The photoelectric conversion device 10A is supported by, for example, a support substrate 1. The support substrate 1 is transparent, and light enters, through the support substrate 1, the photoelectric conversion device 10A. The support substrate 1 can be a substrate used for ordinary photoelectric conversion devices; examples include glass substrates, quartz substrates, semiconductor substrates, and plastic substrates. Note that the term "transparent" in this specification means that transmission of at least a portion of light at wavelengths that is absorbable by the photoelectric conversion layer 3, and does not necessarily mean transmission of light over the entirety of the wavelength range.

Hereinafter, elements of the photoelectric conversion device 10A according to the embodiment will be described.

The photoelectric conversion layer 3 of the photoelectric conversion device 10A is formed from organic semiconductor materials.

The photoelectric conversion layer 3 can be formed by, for example, a coating process such as spin-coating, or a vacuum deposition process of performing heating in a vacuum to vaporize the materials for the layer and to deposit them on a substrate. In the case of spin-coating, the film can be formed under, for example, the air or a $N_2$ atmosphere; the film may be formed at 300 rpm to 3000 rpm; after the spin-coating, a baking treatment may be performed in order to evaporate the solvent to stabilize the film. The baking temperature may be any temperature, and is, for example, 60° C. to 250° C.

Alternatively, the photoelectric conversion layer 3 may be formed by the deposition process in consideration of preventing entry of impurities and forming a multilayer for higher performance with a higher degree of freedom. The deposition apparatus may be a commercially available apparatus. During the deposition, the deposition source may be set at a temperature of 100° C. to 500° C., or 150° C. to 400° C. During the deposition, the degree of vacuum may be set at $1\times10^{-4}$ Pa to 1 Pa, or $1\times10^{-3}$ Pa to 0.1 Pa. The photoelectric conversion layer 3 may be formed by a process of adding, for example, metal fine particles to the deposition source to increase the deposition rate.

The blending ratio of the materials for the photoelectric conversion layer 3 is described in a weight ratio in the case of the coating process, or in a volume ratio in the case of the deposition process. More specifically, in the case of the coating process, the weights of the materials during preparation of the solution are used to define the blending ratio; in the case of the deposition process, during deposition, the thicknesses of the deposition layers of the materials are monitored using a layer thickness meter to define the blending ratio of the materials.

The photoelectric conversion layer 3 is formed of a bulk hetero layer that is a blend film in which a donor organic semiconductor material and an acceptor organic semiconductor material are blended as photoelectric conversion materials. At this time, the acceptor organic semiconductor material may include at least one of fullerene or a fullerene derivative. In this case, in the photoelectric conversion device 10A, electron transfer smoothly occurs between the donor organic semiconductor material and the acceptor organic semiconductor material, to thereby achieve a higher photoelectric conversion efficiency. The acceptor organic semiconductor material may include soluble fullerene. In this case, the acceptor organic semiconductor material is soluble in solvents, which enables formation by a printing process. Incidentally, details of the donor organic semiconductor material and the acceptor organic semiconductor material will be described later.

At least one of the upper electrode 4 or the lower electrode 2 is a transparent electrode that is formed of a conductive material transparent to light of the response wavelengths. To the lower electrode 2 and the upper electrode 4, a bias voltage is applied using wiring (not shown). For example, the bias voltage is set in terms of polarity such that, of the charges generated in the photoelectric conversion layer 3, electrons move to the upper electrode 4 and holes move to the lower electrode 2. Alternatively, the bias voltage may be set such that, of the charges generated in the photoelectric conversion layer 3, holes move to the upper electrode 4 and electrons move to the lower electrode 2.

The bias voltage is preferably applied such that the intensity of the electric field generated in the photoelectric conversion device 10A, specifically, the value obtained by dividing the applied voltage by the distance between the lower electrode 2 and the upper electrode 4, is in a range of $1.0\times10^3$ V/cm to $1.0\times10^7$ V/cm, or in a range of $1.0\times10^4$ V/cm to $1.0\times10^6$ V/cm. In this way, the value of the bias voltage can be adjusted to thereby efficiently move charges to the upper electrode 4, to extract, to the outside, signals corresponding to the charges.

The materials for the lower electrode 2 and the upper electrode 4 may be transparent conductive oxides (TCO; Transparent Conducting Oxide) that have high transmittances for light in the near-infrared light region and have low resistance values. In the case of a photoelectric conversion device having spectral sensitivity in the near-infrared light region, metal thin films of gold (Au) or the like may be used as transparent electrodes; however, in some cases of trying to achieve a transmittance of greater than or equal to 90% for light in the near-infrared light region, the resistance value excessively increases, compared with cases of forming transparent electrodes so as to have a transmittance of 60% to 80%. Thus, compared with metal materials such as Au, TCO provides transparent electrodes having high transparency to near-infrared light and having low resistance values. TCO is not particularly limited, and examples include ITO (Indium Tin Oxide), IZO (Indium Zinc Oxide), AZO (Aluminum-doped Zinc Oxide), FTO (Fluorine-doped Tin Oxide), $SnO_2$, $TiO_2$, and $ZnO_2$. Note that the lower electrode 2 and the upper electrode 4 can be formed of, in accordance with the desired transmittance, one or a combination of a plurality of materials appropriately selected from TCO and metal materials such as aluminum (Al) and Au.

Note that the materials for the lower electrode 2 and the upper electrode 4 are not limited to the above-described conductive materials having high transmittances for light in the near-infrared light region, and may be other materials.

The lower electrode 2 and the upper electrode 4 can be formed by various processes selected in accordance with materials employed. For example, in the case of employing ITO, an electron beam process, a sputtering process, a resistance heating deposition process, a chemical reaction process such as a sol-gel process, or a process such as coating with a dispersion of indium tin oxide may be used. In this case, in the formation of the lower electrode 2 and the upper electrode 4, ITO films formed may be further subjected to, for example, an UV-ozone treatment or a plasma treatment.

In the photoelectric conversion device 10A, upon entry of near-infrared light through the support substrate 1 and the lower electrode 2, photoelectric conversion occurs in the photoelectric conversion layer 3. Of the resultant hole-electron pairs, the holes are collected to the lower electrode 2, and the electrons are collected to the upper electrode 4. Thus, for example, the potential of the lower electrode 2 can be measured, to thereby detect entry of near-infrared light into the photoelectric conversion device 10A.

The photoelectric conversion device according to the embodiment includes a hole-blocking layer 6 (refer to FIG. 2) disposed between the photoelectric conversion layer 3 and an electrode of the photoelectric conversion device 10A, and may further include an electron-blocking layer 5 (refer to FIG. 2) that sandwiches, together with the hole-blocking layer 6, the photoelectric conversion layer 3. The electron-blocking layer 5 and the hole-blocking layer 6 sandwich the photoelectric conversion layer 3, to thereby suppress injection of electrons from the lower electrode 2 into the photoelectric conversion layer 3 and injection of holes from the upper electrode 4 into the photoelectric conversion layer 3. As a result, dark current can be suppressed. Incidentally, details of the electron-blocking layer 5 and the hole-blocking layer 6 will be described later and are not described here.

Hereinafter, the photoelectric conversion device according to the embodiment will be described with reference to FIG. 2. FIG. 2 is a schematic sectional view of a photoelectric conversion device 10B according to the embodiment.

Figure 2:
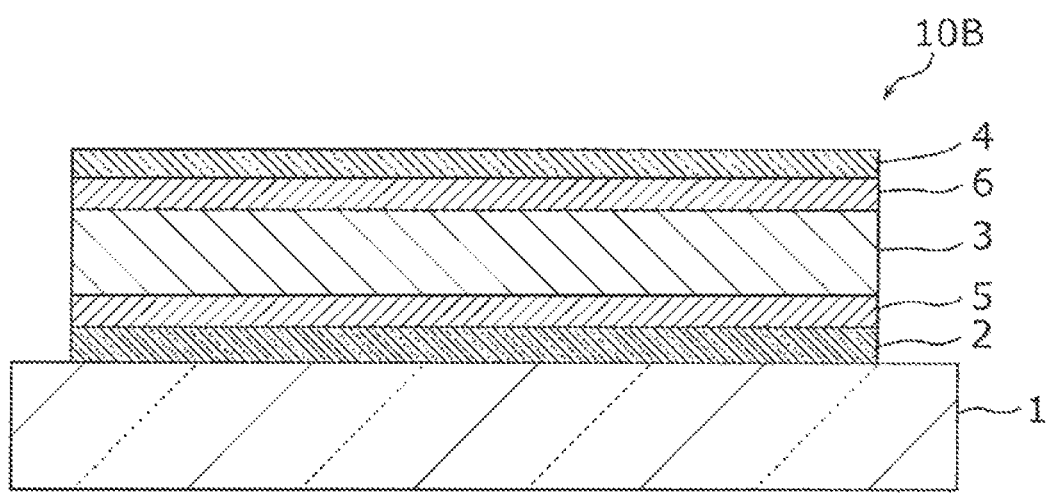
FIG. 2 is a schematic sectional view illustrating an example of a photoelectric conversion device according to an embodiment.

Note that, in the photoelectric conversion device 10B illustrated in FIG. 2, the same elements as in the photoelectric conversion device 10A illustrated in FIG. 1 are denoted by the same reference signs.

As illustrated in FIG. 2, the photoelectric conversion device 10B according to the embodiment includes a lower electrode 2 serving as the first electrode, an upper electrode 4 serving as the second electrode, and a photoelectric conversion layer 3 disposed so as to be sandwiched between the electrodes that are the first electrode and the second electrode. Furthermore, the photoelectric conversion device 10B includes a hole-blocking layer 6 disposed between the second electrode and the photoelectric conversion layer 3. More specifically, the photoelectric conversion device 10B includes an electron-blocking layer 5 disposed between the lower electrode 2 and the photoelectric conversion layer 3, and the hole-blocking layer 6 disposed between the upper electrode 4 and the photoelectric conversion layer 3. Incidentally, the formation process and the like of the photoelectric conversion layer 3 are the same as those described above for the photoelectric conversion device 10A, and are not described here.

The photoelectric conversion layer 3 is a bulk hetero layer formed of a blend film including a donor organic semiconductor material and an acceptor organic semiconductor material. In the bulk hetero layer forming the photoelectric conversion layer 3, contact between the donor organic semiconductor material and the acceptor organic semiconductor material can cause electron excitation from the donor organic semiconductor material to the acceptor organic semiconductor material, to generate charges even in the dark state. Thus, contact between the donor organic semiconductor material and the acceptor organic semiconductor material can be reduced, to thereby suppress the dark current. From the viewpoint of charge mobility, when the bulk hetero layer includes a large amount of an acceptor organic semiconductor material such as a fullerene derivative, the device resistance can be suppressed.

The photoelectric conversion layer 3 has absorption wavelengths in the near-infrared light region. Specifically, the absorption spectrum of the photoelectric conversion layer 3 has an absorption edge in the near-infrared light region. Thus, the photoelectric conversion device 10B including the photoelectric conversion layer 3 has spectral sensitivity in the near-infrared light region. Specifically, as described above, the photoelectric conversion device 10B has, as an index of spectral sensitivity, an external quantum efficiency of, at a wavelength in the near-infrared light region, greater than or equal to 1%; the external quantum efficiency may be greater than or equal to 10%, or greater than or equal to 20%. The photoelectric conversion layer 3 may have a maximum-absorption wavelength in the near-infrared light region. In the photoelectric conversion layer 3, as the donor organic semiconductor material described later, a material having absorption wavelengths in the near-infrared light region is employed.

Hereinafter, specific examples of the donor organic semiconductor material and the acceptor organic semiconductor material will be described.

The donor organic semiconductor material is mainly represented by a hole-transport organic compound and is an organic compound that has electron-donating properties. More specifically, the donor organic semiconductor material is, of two organic materials used in contact with each other, an organic compound having a lower ionization potential. Thus, as the donor organic semiconductor material, any organic compound can be used as long as the organic compound has absorption wavelengths in the near-infrared light region and has electron-donating properties. Examples include triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, naphthalocyanine compounds, cyanine compounds, merocyanine compounds, oxonol compounds, polyamine compounds, indole compounds, pyrrole compounds, pyrazole compounds, polyarylene compounds, condensed aromatic carbon ring compounds (naphthalene derivatives, anthracene derivatives, phenanthrene derivatives, tetracene derivatives, pyrene derivatives, perylene derivatives, and fluoranthene derivatives), and metal complexes having a nitrogen-containing heterocyclic compound as a ligand. Note that these are non-limiting examples and, as described above, an organic compound that has a lower ionization potential than the organic compound used as the acceptor organic semiconductor material can be used as the donor organic semiconductor material.

The acceptor organic semiconductor material is mainly represented by an electron-transport organic compound and is an organic compound that has electron-accepting properties. More specifically, the acceptor organic semiconductor material is, of two organic compounds used in contact with each other, an organic compound having a higher electron affinity. Thus, as the acceptor organic compound, any organic compound can be used as long as it is an electron-accepting organic compound. Examples include fullerene, fullerene derivatives, condensed aromatic carbon ring compounds (naphthalene derivatives, anthracene derivatives, phenanthrene derivatives, tetracene derivatives, pyrene derivatives, perylene derivatives, and fluoranthene derivatives), five- to seven-membered heterocyclic compounds containing a nitrogen atom, an oxygen atom, or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzooxazole, benzothiazole, carbazole, purine, triazolopyridazine, triazolopyrimidine, tetrazaindene, oxadiazole, imidazopyridine, pyrrolidine, pyrrolopyridine, thiadiazolopyridine, dibenzazepine, and tribenzazepine), polyarylene compounds, fluorene compounds, cyclopentadiene compounds, silyl compounds, and metal complexes having a nitrogen-containing heterocyclic compound as a ligand. Note that these are non-limiting examples, and, as described above, an organic compound having a higher electron affinity than the organic compound used as the donor organic semiconductor material can be used as the acceptor organic semiconductor material.

Note that, in the photoelectric conversion device 10B according to the embodiment, the acceptor organic semiconductor material preferably includes at least one selected from the group consisting of fullerene and fullerene derivatives. In this case, in the photoelectric conversion device 10B according to the embodiment, electron transfer smoothly occurs between the donor organic semiconductor material and the acceptor organic semiconductor material, to thereby provide a higher photoelectric conversion efficiency. The acceptor organic semiconductor material preferably includes soluble fullerene. This enables formation by a printing process.

Figure 3:
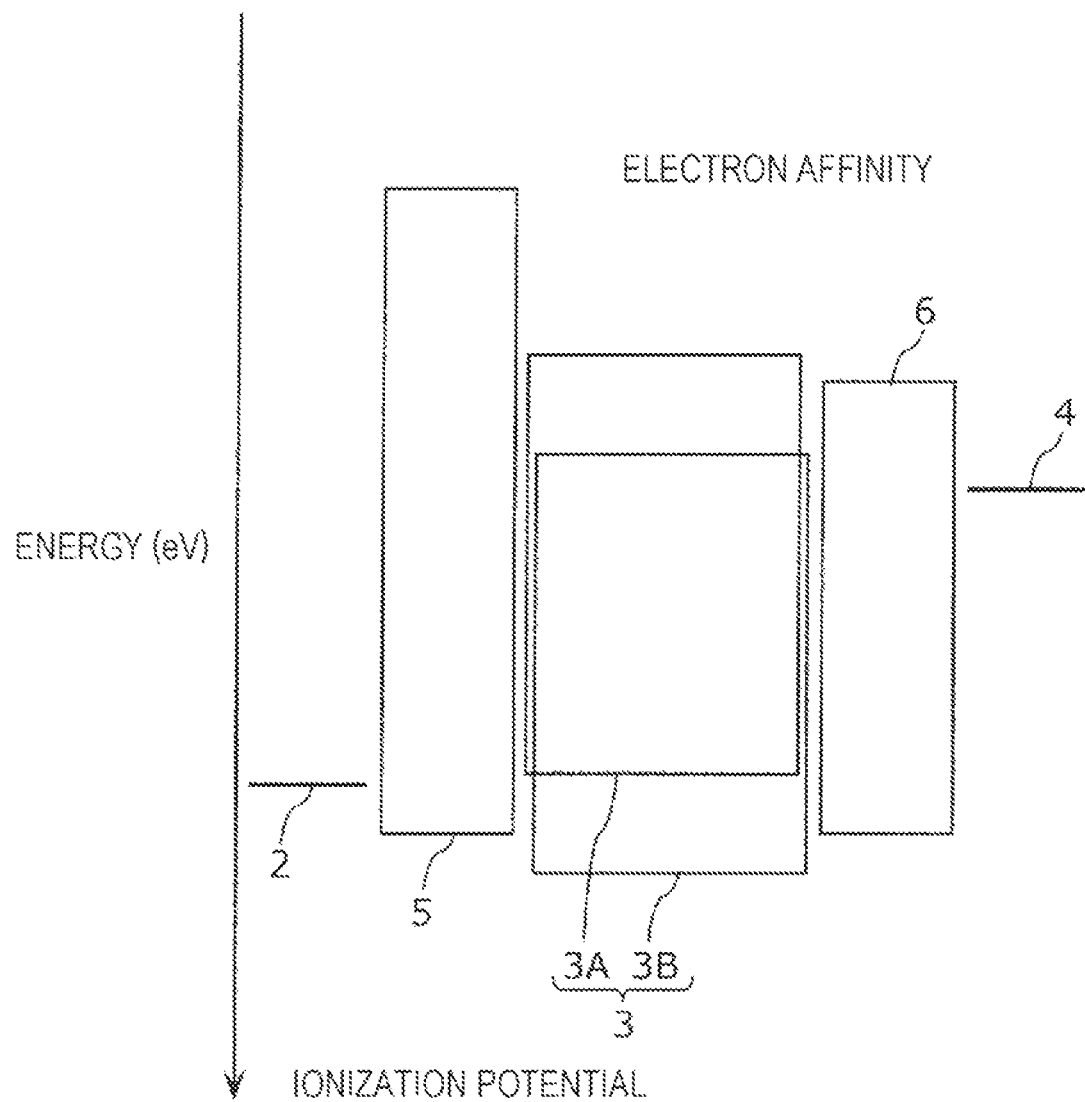
FIG. 3 is an example of the energy band diagram of the photoelectric conversion device illustrated in FIG. 2.

FIG. 3 illustrates a schematic view illustrating an example of the energy band of the photoelectric conversion device 10B having the configuration illustrated in FIG. 2.

In the photoelectric conversion device 10B, the electron-blocking layer 5 has an ionization potential higher than the ionization potential of a donor organic semiconductor material 3A included in the photoelectric conversion layer 3. In the photoelectric conversion device 10B, the hole-blocking layer 6 has an electron affinity lower than the electron affinity of an acceptor organic semiconductor material 3B included in the photoelectric conversion layer 3.

The electron-blocking layer 5 is disposed in order to reduce dark current caused by injection of electrons from the lower electrode 2, and suppresses injection of electrons from the lower electrode 2 into the photoelectric conversion layer 3. As the material for the electron-blocking layer 5, the above-described organic compound or hole-transport organic compound used for the donor organic semiconductor material may also be employed. In order to suppress injection of electrons from the lower electrode 2 into the photoelectric conversion layer 3, the material for the electron-blocking layer 5 has an electron affinity lower than at least the work function of the lower electrode 2 and the electron affinity of the acceptor organic semiconductor material 3B of the photoelectric conversion layer 3.

As illustrated in FIG. 3, the electron-blocking layer 5 has a higher ionization potential and a lower electron affinity than the donor organic semiconductor material 3A in the photoelectric conversion layer 3.

The hole-blocking layer 6 is disposed in order to reduce dark current caused by injection of holes from the upper electrode 4. In order to suppress injection of holes from the upper electrode 4 into the photoelectric conversion layer 3, the material for the hole-blocking layer 6 has an ionization potential higher than at least the work function of the upper electrode 4 and the ionization potential of the donor organic semiconductor material 3A of the photoelectric conversion layer 3. Note that, in FIG. 3, the hole-blocking layer 6 has an ionization potential lower than the ionization potential of the acceptor semiconductor material 3B of the photoelectric conversion layer 3; however, this is a non-limiting example, and the hole-blocking layer 6 may have an ionization potential higher than or equal to the ionization potential of the acceptor semiconductor material 3B of the photoelectric conversion layer 3.

In order to suppress an increase in the dark current due to generation of charges (holes) at the interface between the photoelectric conversion layer 3 and the hole-blocking layer 6, an increased energy difference is provided between the ionization potential of the donor organic semiconductor material 3A of the photoelectric conversion layer 3 and the electron affinity of the hole-blocking layer 6. In particular, the electron affinity of the hole-blocking layer 6 can be made higher than the electron affinity of the acceptor organic semiconductor material 3B of the photoelectric conversion layer 3, to thereby provide a stronger effect of suppressing the dark current.

The photoelectric conversion layer 3 has an ionization potential of lower than or equal to 5.3 eV. In such a case where the photoelectric conversion layer 3 has a relatively low ionization potential, the hole-blocking layer 6 according to the embodiment considerably provides the effect of suppressing the dark current. In the case of the photoelectric conversion layer 3 formed of a blend film including a donor organic semiconductor material and an acceptor organic semiconductor material, the donor semiconductor material has a lower ionization potential than the acceptor semiconductor material. Thus, the ionization potential of the photoelectric conversion layer 3 is the ionization potential of the donor organic semiconductor material in the photoelectric conversion layer 3.

In order not to hinder optical absorption by the photoelectric conversion layer 3, the hole-blocking layer 6 may have a high transmittance for near-infrared light; as the material for the hole-blocking layer 6, a material that does not have absorption in the visible light region may be selected; and the hole-blocking layer 6 may be formed so as to have a small thickness. The thickness of the hole-blocking layer 6 depends on, for example, the configuration of the photoelectric conversion layer 3 and the thickness of the upper electrode 4, and may be, for example, 2 nm to 50 nm. As the material for the hole-blocking layer 6, the above-described organic compound or electron-transport organic compound used for the acceptor organic semiconductor material may also be employed.

Incidentally, as illustrated in FIG. 3, the photoelectric conversion device 10B includes a single hole-blocking layer 6; alternatively, a plurality of hole-blocking layers may be disposed. In such a case where a plurality of hole-blocking layers are disposed, a hole-blocking layer adjacent to the photoelectric conversion layer has an electron affinity lower than the electron affinity of the acceptor organic semiconductor material of the photoelectric conversion layer.

In the case of forming the electron-blocking layer 5, the material for the lower electrode 2 is selected from the above-described materials in consideration of, for example, the adhesion to the electron-blocking layer 5, electron affinity, ionization potential, and stability. Note that the same applies to the upper electrode 4.

In summary, the photoelectric conversion device 10B according to the embodiment uses the above-described photoelectric conversion materials, to thereby gain optical absorption properties in the near-infrared light region and achieve reduction in the dark current. Therefore, the embodiment provides photoelectric conversion devices that can detect near-infrared light, such as imaging devices.

Imaging Apparatus

Hereinafter, an imaging apparatus according to an embodiment will be described with reference to drawings. The imaging apparatus according to the embodiment is, for example, a charge-read-out-mode imaging apparatus.

Figure 4:
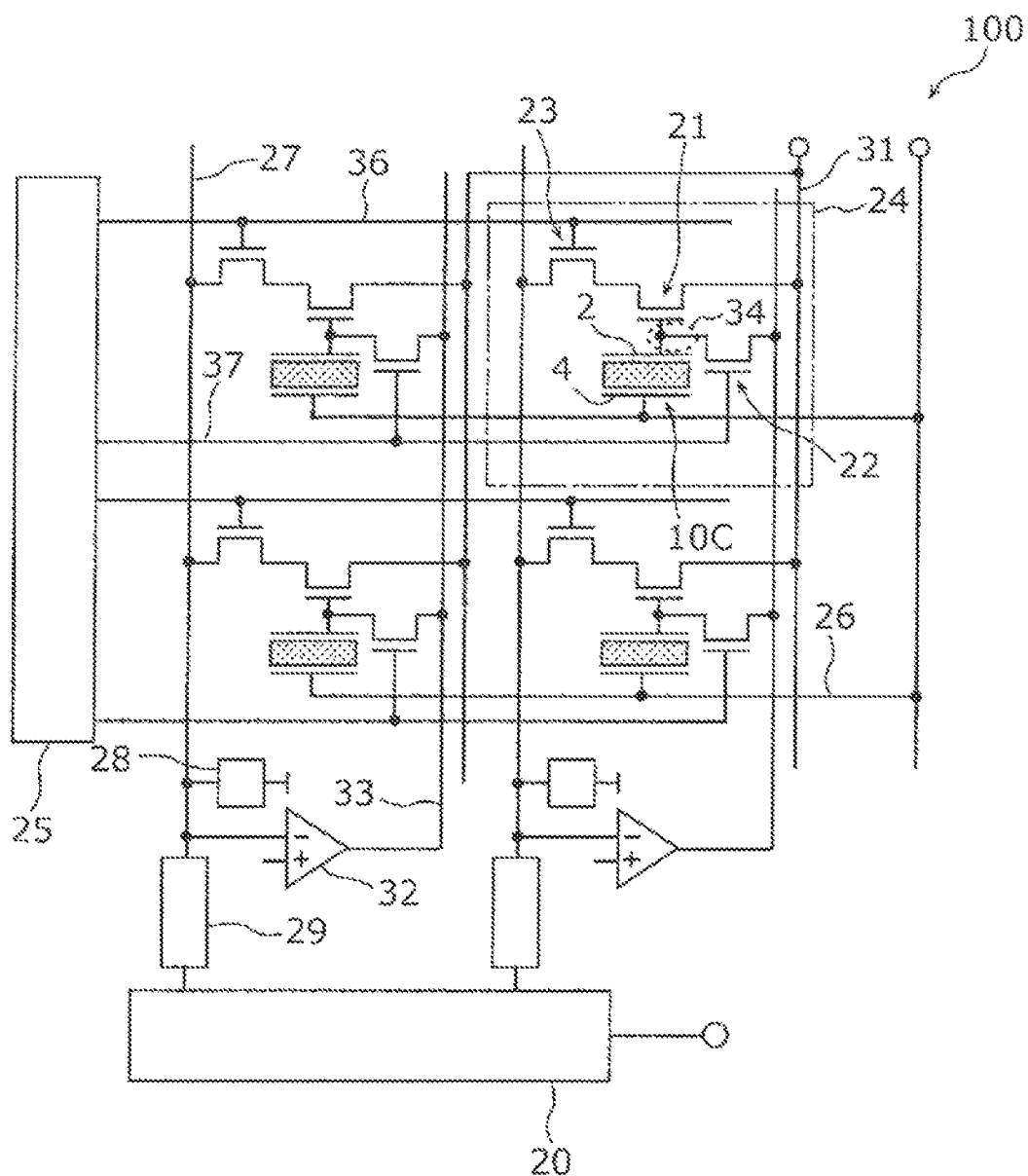
FIG. 4 illustrates an example of the circuit configuration of an imaging apparatus according to an embodiment.
Figure 5:
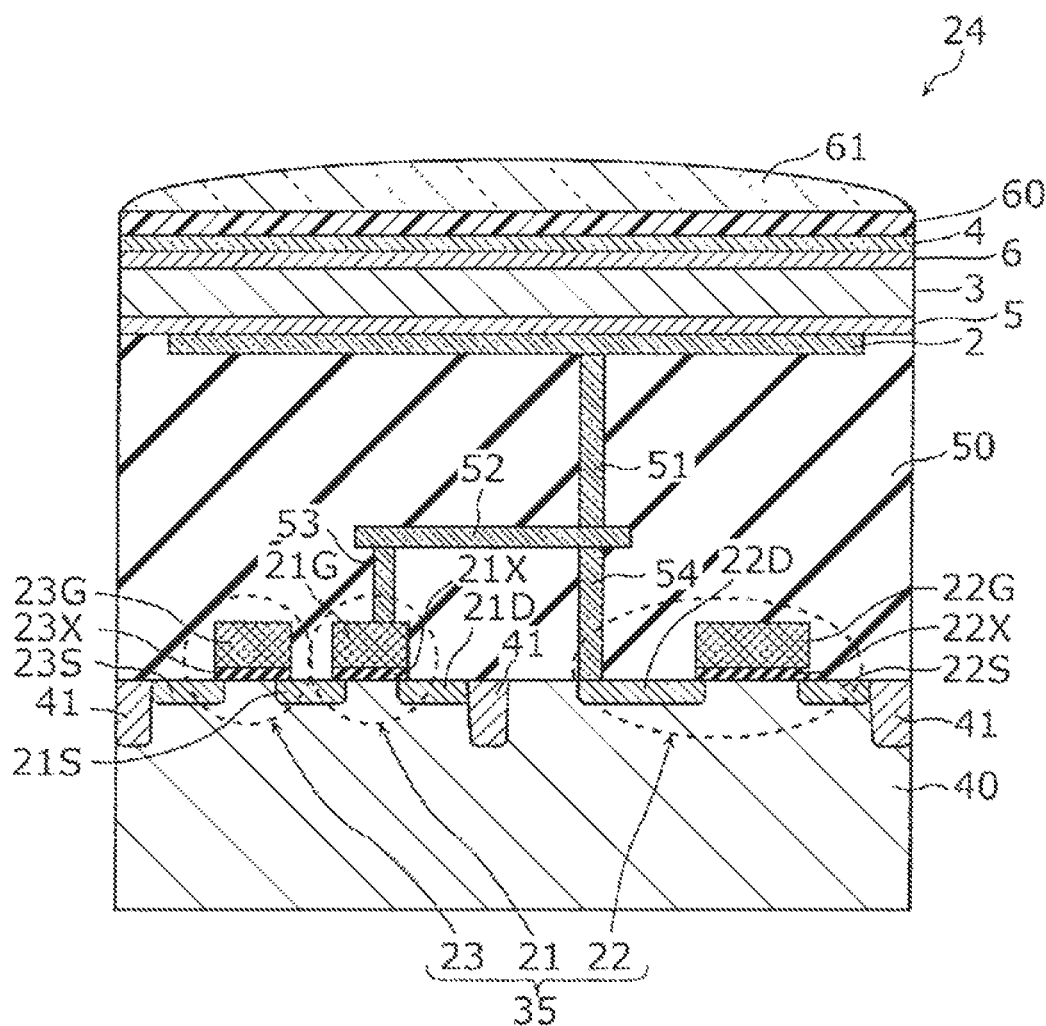
FIG. 5 is a schematic sectional view illustrating an example of the device structure of a pixel of an imaging apparatus according to an embodiment.

The imaging apparatus according to the embodiment will be described with reference to FIG. 4 and FIG. 5. FIG. 4 illustrates an example of the circuit configuration of an imaging apparatus 100 according to the embodiment. FIG. 5 is a schematic sectional view illustrating an example of the device structure of a pixel 24 in the imaging apparatus 100 according to the embodiment.

The imaging apparatus 100 according to the embodiment includes a semiconductor substrate 40 serving as the substrate, and the pixel 24 including a charge detection circuit 35 disposed on the semiconductor substrate 40, a photoelectric conversion unit 10C disposed on the semiconductor substrate 40, and a charge accumulation node 34 electrically connected to the charge detection circuit 35 and the photoelectric conversion unit 10C. The photoelectric conversion unit 10C of the pixel 24 includes the above-described photoelectric conversion device 10B. The charge accumulation node 34 accumulates charges obtained in the photoelectric conversion unit 10C. The charge detection circuit 35 detects the charges accumulated in the charge accumulation node 34. Note that the charge detection circuit 35 disposed in the semiconductor substrate 40 may be disposed on the semiconductor substrate 40, or may be disposed directly within the semiconductor substrate 40.

As illustrated in FIG. 4, the imaging apparatus 100 includes a plurality of pixels 24 and peripheral circuits. The imaging apparatus 100 is an organic image sensor implemented by a single-chip integrated circuit, and includes a pixel array including a plurality of pixels 24 arranged two-dimensionally.

The plurality of pixels 24 are arranged, on the semiconductor substrate 40, two-dimensionally, specifically in the column direction and the row direction, to form a photosensitive region that is a pixel region. FIG. 4 illustrates an example in which the pixels 24 are arranged in a matrix constituted by two columns and two rows. Note that, in FIG. 4, for convenience of illustration, circuits (such as a pixel electrode control circuit) for setting individually the sensitivity of the pixels 24 are not shown. Alternatively, the imaging apparatus 100 may be a line sensor. In this case, the plurality of pixels 24 may be arranged one-dimensionally. Note that, in this specification, the column direction and the row direction respectively mean a direction in which columns extend and a direction in which rows extend. In other words, the vertical direction is the row direction while the horizontal direction is the column direction.

As illustrated in FIG. 4 and FIG. 5, each pixel 24 includes the charge accumulation node 34 electrically connected to the photoelectric conversion unit 10C and the charge detection circuit 35. The charge detection circuit 35 includes an amplification transistor 21, a reset transistor 22, and an address transistor 23.

The photoelectric conversion unit 10C includes a lower electrode 2 disposed as a pixel electrode and an upper electrode 4 disposed as a counter electrode. The photoelectric conversion unit 10C includes the above-described photoelectric conversion device 10B. To the upper electrode 4, a predetermined bias voltage is applied via a counter-electrode signal line 26.

The lower electrode 2 is connected to a gate electrode 21G of the amplification transistor 21; the signal charges collected by the lower electrode 2 are accumulated at the charge accumulation node 34 positioned between the lower electrode 2 and the gate electrode 21G of the amplification transistor 21. In this embodiment, signal charges are holes; alternatively, the signal charges may be electrons.

The signal charges accumulated at the charge accumulation node 34 are applied, as a voltage corresponding to the amount of the signal charges, to the gate electrode 21G of the amplification transistor 21. The amplification transistor 21 amplifies this voltage, which is selectively read out, as a signal voltage, by the address transistor 23. The reset transistor 22, the source/drain electrode of which is connected to the lower electrode 2, resets the signal charges accumulated at the charge accumulation node 34. Stated another way, the reset transistor 22 resets the potentials of the gate electrode 21G of the amplification transistor 21 and the lower electrode 2.

In order to perform the above-described operations in the plurality of pixels 24 selectively, the imaging apparatus 100 includes power lines 31, vertical signal lines 27, address signal lines 36, and reset signal lines 37, and these lines are connected to the pixels 24. Specifically, such a power line 31 is connected to the source/drain electrode of the amplification transistor 21; such a vertical signal line 27 is connected to the source/drain electrode of the address transistor 23. Such an address signal line 36 is connected to a gate electrode 23G of the address transistor 23. Such a reset signal line 37 is connected to a gate electrode 22G of the reset transistor 22.

The peripheral circuits include a vertical scanning circuit 25, a horizontal signal read-out circuit 20, a plurality of column signal processing circuits 29, a plurality of load circuits 28, and a plurality of differential amplifiers 32. The vertical scanning circuit 25 is also referred to as a column scanning circuit. The horizontal signal read-out circuit 20 is also referred to as a row scanning circuit. The column signal processing circuits 29 are also referred to as column signal accumulation circuits. The differential amplifiers 32 are also referred to as feedback amplifiers.

The vertical scanning circuit 25 is connected to the address signal lines 36 and the reset signal lines 37, selects the plurality of pixels 24 that are arranged in a column, and reads out signal voltages and resets the potentials of the lower electrodes 2. The power lines 31 serving as source-follower power sources supply predetermined power-source voltages to the pixels 24. The horizontal signal read-out circuit 20 is electrically connected to the plurality of column signal processing circuits 29. Such a column signal processing circuit 29 is electrically connected, via a vertical signal line 27 corresponding to one of the rows, to the pixels 24 that are arranged in the one row. The load circuits 28 are electrically connected to the corresponding vertical signal lines 27. The load circuits 28 and the amplification transistors 21 form source-follower circuits.

The plurality of differential amplifiers 32 are individually disposed so as to correspond to rows. The negative input terminal of such a differential amplifier 32 is connected to the corresponding vertical signal line 27. The output terminal of the differential amplifier 32 is connected, via a feedback line 33 corresponding to one of the rows, to pixels 24.

The vertical scanning circuit 25 applies, via the address signal lines 36, column selection signals for controlling on/off of the address transistors 23 to the gate electrodes 23G of the address transistors 23. Thus, the column to be read out is scanned and selected. From the pixels 24 of the selected column, signal voltages are read out to the vertical signal line 27. In addition, the vertical scanning circuit 25 applies, via the reset signal lines 37, reset signals for controlling on/off of the reset transistors 22 to the gate electrodes 22G of the reset transistors 22. Thus, the column of pixels 24 to be subjected to the reset operation is selected. The vertical signal lines 27 transmit the signal voltages read out from the pixels 24 selected by the vertical scanning circuit 25, to the column signal processing circuits 29.

The column signal processing circuits 29 perform, for example, a noise suppression signal processing represented by correlated double sampling and analog-digital conversion (AD conversion).

The horizontal signal read-out circuit 20 reads out signals sequentially from the plurality of column signal processing circuits 29 to a horizontal common signal line (not shown).

The differential amplifier 32 is connected, via the feedback line 33, to the drain electrode of the reset transistor 22. Thus, when the address transistor 23 and the reset transistor 22 are electrically connected to each other, the differential amplifier 32 receives, at its negative terminal, the output value of the address transistor 23. The differential amplifier 32 performs feedback operation such that the gate potential of the amplification transistor 21 becomes the predetermined feedback voltage. At this time, the output voltage value of the differential amplifier 32 is 0 V or a positive voltage close to 0 V. The feedback voltage means the output voltage of the differential amplifier 32.

As illustrated in FIG. 5, the pixel 24 includes the semiconductor substrate 40, the charge detection circuit 35, the photoelectric conversion unit 10C, and the charge accumulation node 34 (refer to FIG. 4).

The semiconductor substrate 40 may be, for example, an insulating substrate having a semiconductor layer on a surface on which a photosensitive region is to be formed, and is, for example, a p-type silicon substrate. The semiconductor substrate 40 includes impurity regions (here, n-type regions) 21D, 21S, 22D, 22S, and 23S, and isolation regions 41 for electrical isolation between the pixels 24. Here, such an isolation region 41 is disposed also between the impurity region 21D and the impurity region 22D. This suppresses leakage of signal charges accumulated in the charge accumulation node 34. Note that the isolation regions 41 are formed by performing, for example, implantation of acceptor ions under predetermined implantation conditions.

The impurity regions 21D, 21S, 22D, 22S, and 23S are typically diffusion layers formed within the semiconductor substrate 40. As illustrated in FIG. 5, the amplification transistor 21 includes the impurity regions 21S and 21D and the gate electrode 21G. The impurity region 21S and the impurity region 21D respectively function as, for example, the source region and the drain region of the amplification transistor 21. Between the impurity region 21S and the impurity region 21D, the channel region of the amplification transistor 21 is formed.

Similarly, the address transistor 23 includes the impurity regions 23S and 21S, and the gate electrode 23G connected to the address signal line 36. In this example, the amplification transistor 21 and the address transistor 23 share the impurity region 21S to thereby be electrically connected to each other. The impurity region 23S functions as, for example, the source region of the address transistor 23. The impurity region 23S has connection to a vertical signal line 27 illustrated in FIG. 4.

The reset transistor 22 includes the impurity regions 22D and 22S, and the gate electrode 22G connected to the reset signal line 37. The impurity region 22S functions as, for example, the source region of the reset transistor 22. The impurity region 22S has connection to a reset signal line 37 illustrated in FIG. 4.

Over the semiconductor substrate 40, an interlayer dielectric layer 50 is disposed so as to cover the amplification transistor 21, the address transistor 23, and the reset transistor 22.

Within the interlayer dielectric layer 50, a wiring layer (not shown) can be disposed. The wiring layer is typically formed of a metal such as copper, and can include, as portions, wiring such as the above-described vertical signal line 27, for example. The number of dielectric layers within the interlayer dielectric layer 50 and the number of layers included in the wiring layer disposed within the interlayer dielectric layer 50 can be appropriately set.

Within the interlayer dielectric layer 50, a contact plug 54 connected to the impurity region 22D of the reset transistor 22, a contact plug 53 connected to the gate electrode 21G of the amplification transistor 21, a contact plug 51 connected to the lower electrode 2, and a wiring 52 that connects together the contact plug 51, the contact plug 54, and the contact plug 53 are disposed. As a result, the impurity region 22D of the reset transistor 22 is electrically connected to the gate electrode 21G of the amplification transistor 21.

The charge detection circuit 35 detects signal charges trapped by the lower electrode 2, and outputs a signal voltage. The charge detection circuit 35 includes the amplification transistor 21, the reset transistor 22, and the address transistor 23, and is formed in the semiconductor substrate 40.

The amplification transistor 21 includes the impurity region 21D and the impurity region 21S formed within the semiconductor substrate 40 and respectively functioning as a drain electrode and a source electrode, a gate dielectric layer 21X formed on the semiconductor substrate 40, and the gate electrode 21G formed on the gate dielectric layer 21X.

The reset transistor 22 includes the impurity region 22D and the impurity region 22S formed within the semiconductor substrate 40 and respectively functioning as a drain electrode and a source electrode, a gate dielectric layer 22X formed on the semiconductor substrate 40, and the gate electrode 22G formed on the gate dielectric layer 22X.

The address transistor 23 includes the impurity regions 21S and 23S formed within the semiconductor substrate 40 and respectively functioning as a drain electrode and a source electrode, a gate dielectric layer 23X formed on the semiconductor substrate 40, and a gate electrode 23G formed on the gate dielectric layer 23X. The impurity region 21S is shared by the amplification transistor 21 and the address transistor 23, so that the amplification transistor 21 and the address transistor 23 are connected in series.

Over the interlayer dielectric layer 50, the above-described photoelectric conversion units 10C are disposed. Stated another way, in this embodiment, a plurality of pixels 24 constituting a pixel array are formed over the semiconductor substrate 40. The plurality of pixels 24 two-dimensionally arranged over the semiconductor substrate 40 form a photosensitive region. The distance (pixel pitch) between two adjacent pixels 24 may be, for example, about 2 μm.

Such a photoelectric conversion unit 10C includes the above-described structure of the photoelectric conversion device 10B.

Over the photoelectric conversion unit 10C, a color filter 60 is formed; over the color filter 60, a microlens 61 is formed. The color filter 60 is formed as, for example, an on-chip color filter by patterning, and is formed from, for example, a photosensitive resin in which a dye or a pigment is dispersed. The microlens 61 is formed as, for example, an on-chip microlens, and is formed from, for example, an ultraviolet photosensitive material.

The imaging apparatus 100 can be produced by ordinary semiconductor production processes. In particular, in the case of using, as the semiconductor substrate 40, a silicon substrate, various silicon semiconductor processes can be used to achieve the production.

In summary, the embodiments provide a photoelectric conversion device and an imaging apparatus that have high optical absorbance in the near-infrared light region and that can have low dark current.

EXAMPLES

Hereinafter, Examples are used to specifically describe photoelectric conversion devices according to the present disclosure; however, the present disclosure is not at all limited to the following Examples alone. Specifically, various samples according to embodiments of the present disclosure were prepared and measured in terms of absorption edge, ionization potential, electron affinity, and dark current.

Hereafter, the phenyl group may be denoted by Ph; $C_4H_9$ may be denoted by Bu; $C_6H_{13}$ may be denoted by Hex; and $C_{48}H_{26}N_8$ may be denoted by Nc.

Measurement of Absorption Edges and Ionization Potentials of Photoelectric Conversion Layers Hereinafter, Example 1, Example 2, and Comparative Example 1 will be described to thereby specifically describe the absorption edges and the ionization potentials of photoelectric conversion layers according to the present disclosure.

Example 1

Preparation of Sample

As the support substrate, a quartz glass plate (quartz substrate) having a thickness of 0.7 mm was employed; on the substrate, as the photoelectric conversion layer, a blend film was formed by applying a mixed solution of a donor organic semiconductor material that was PCPDTBT (manufactured by Merck/Sigma-Aldrich, Structural formula (1) below), and an acceptor organic semiconductor material that was phenyl $C_{61}$ butyric acid methyl ester (PCBM: ([6,6]-Phenyl-C61-Butyric Acid Methyl Ester, manufactured by Frontier Carbon Corporation), Structural formula (2) below) by a spin-coating process. In the mixed solution, the weight ratio of PCPDTBT and PCBM is 1:3, and the solvent is chlorobenzene. In the mixed solution, the concentrations of PCPDTBT and PCBM are 30 mg/ml. Incidentally, the obtained blend film was found to have a thickness of about 150 nm.

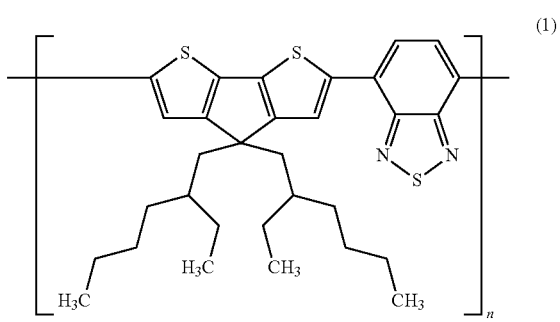

(1)

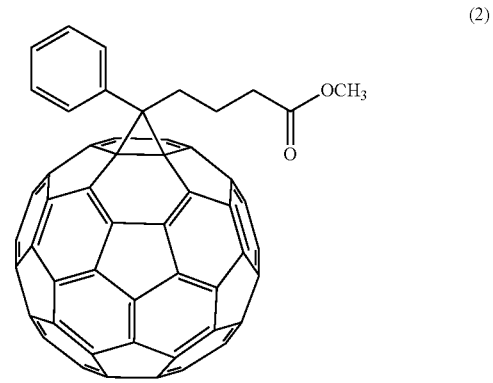

(2)

Measurement of Absorption Edge

Figure 6:
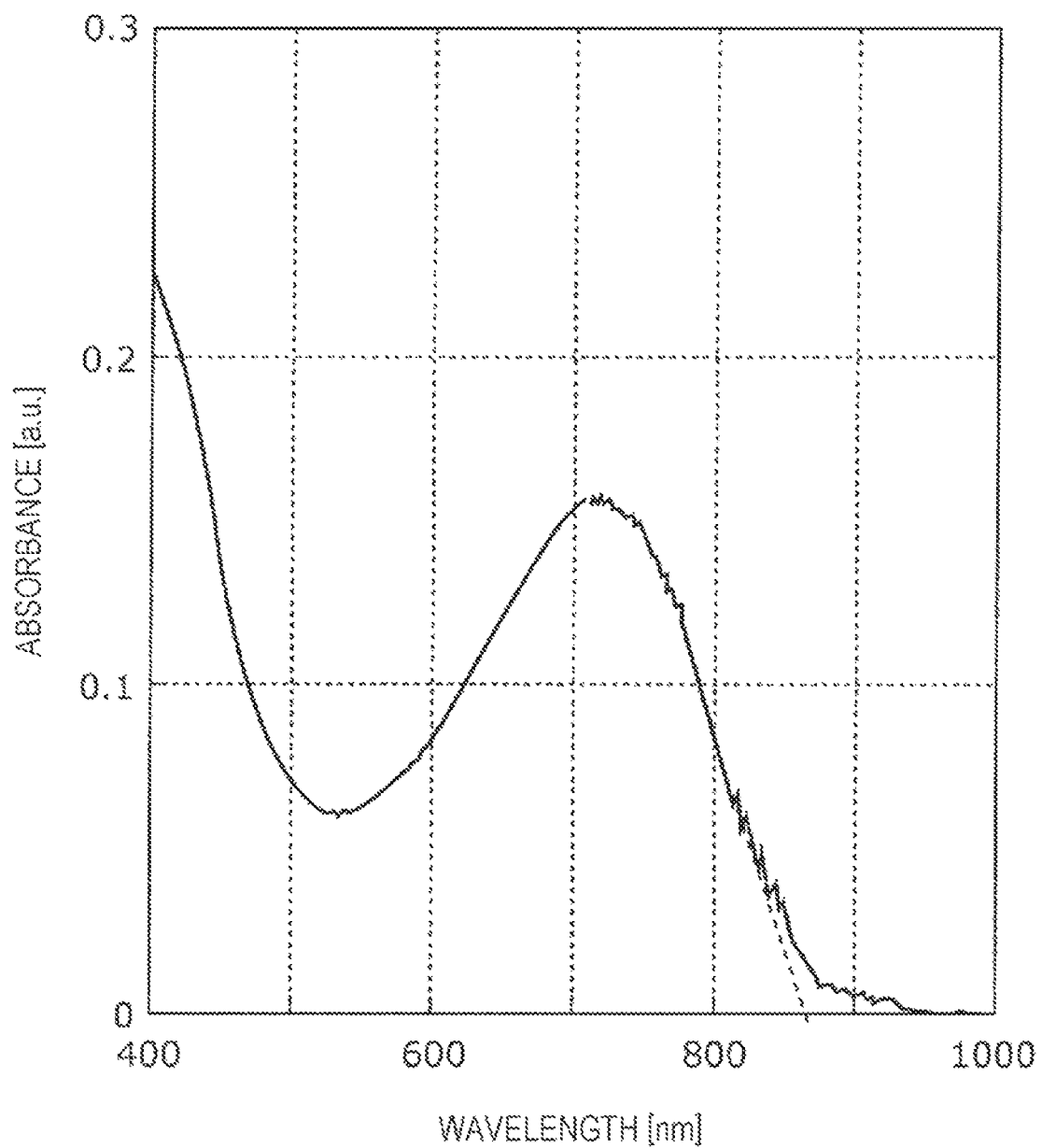
FIG. 6 illustrates the absorption spectrum of the photoelectric conversion layer of Example 1.

The photoelectric conversion layer formed on the quartz substrate was measured with a spectrophotometer (manufactured by Hitachi High-Technologies Corporation, U4100) in terms of absorption spectrum. The obtained absorption spectrum is shown in FIG. 6. The photoelectric conversion layer of Example 1 was found to have a maximum-absorption peak at about 715 nm. On the basis of the position of the abrupt increase on the longer-wavelength side in the absorption spectrum, the absorption edge was estimated. Note that, in this Example, the intersection of the wavelength axis (where absorbance=0) and a tangent extending from a point of the maximum slope in the abrupt increase on the longer-wavelength side in the absorption spectrum was determined as the absorption edge. The obtained measurement result is described in Table 1.

Measurement of Ionization Potential

The same photoelectric conversion layer as in <Preparation of sample> above was formed on an ITO substrate, and measured in terms of ionization potential. The ionization potential measurement was performed with a photoemission yield spectrometer in air (AC-3, manufactured by Riken Keiki Co., Ltd.). In the ionization potential measurement, while the irradiation energy of ultraviolet radiation is changed, the number of photoelectrons is detected. Thus, the energy where photoelectrons are first detected is determined as the ionization potential. The obtained measurement result is described in Table 1.

Example 2

The same procedures as in Example 1 were carried out to perform the preparation of a sample, the measurement of an absorption edge, and the measurement of ionization potential except that, as the donor organic semiconductor material, PCPDTBT was replaced by $(OBu)_8Si(OPOPh-3,5bisCF_3)_2Nc$ represented by Structural formula (3) below (synthesized on the basis of an unpublished patent application filed by the present applicant, Japanese Patent Application No. 2018-215957). Incidentally, the obtained blend film was found to have a thickness of about 230 nm.

(3)

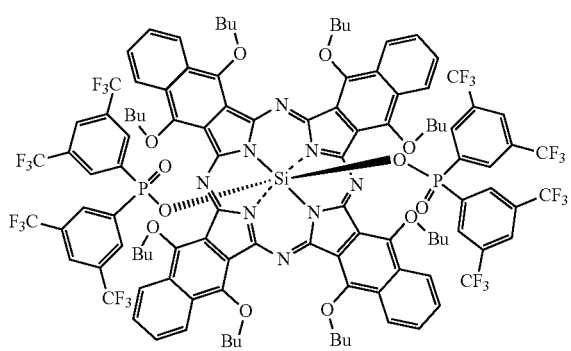

Figure 7:
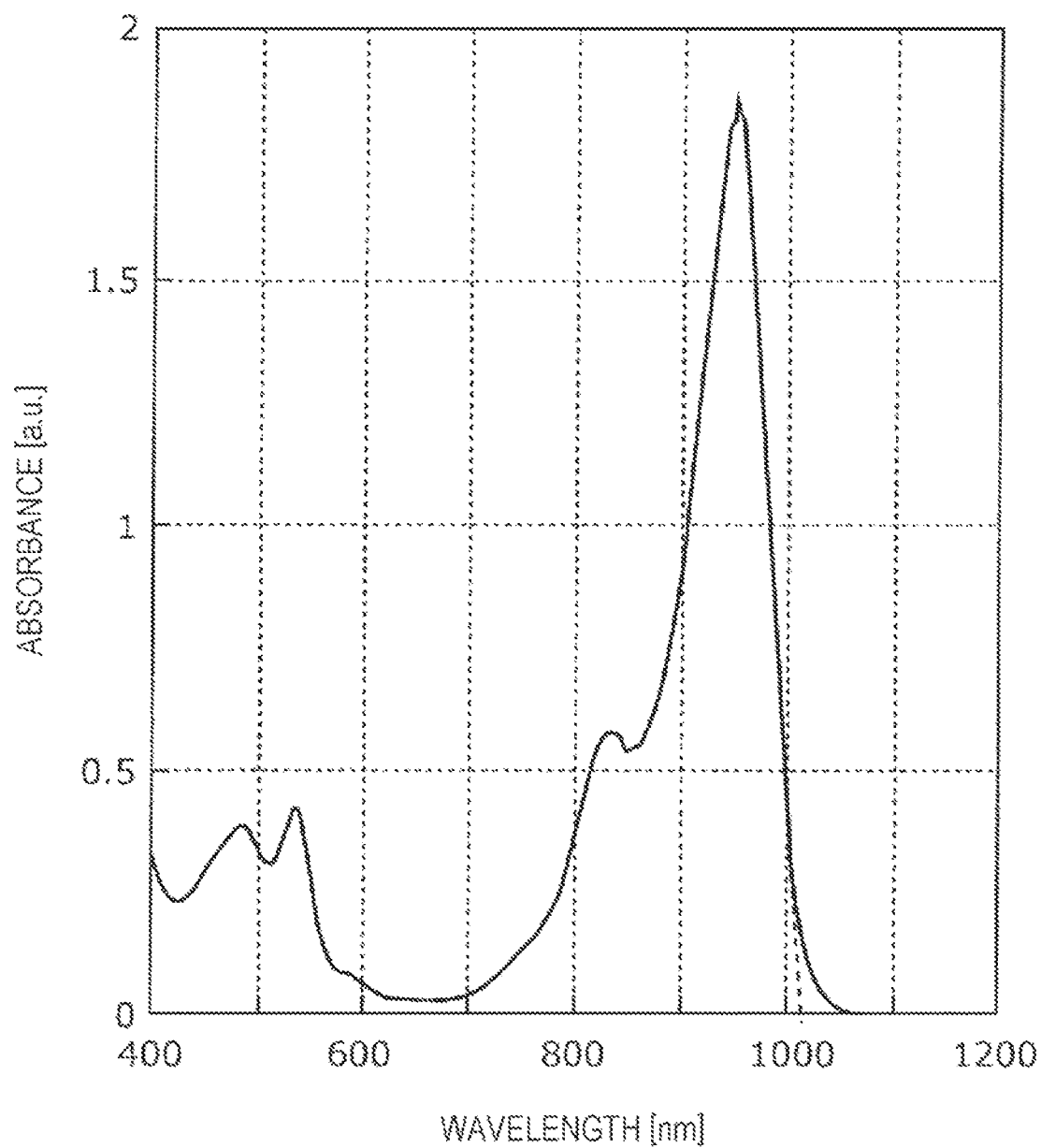
FIG. 7 illustrates the absorption spectrum of the photoelectric conversion layer of Example 2.

The obtained absorption spectrum is shown in FIG. 7. The photoelectric conversion layer of Example 2 was found to have a maximum-absorption peak at about 950 nm. The measurement results of the absorption edge and the ionization potential are described in Table 1.

Comparative Example 1

The same procedures as in Example 1 were carried out to perform the preparation of a sample, the measurement of an absorption edge, and the measurement of ionization potential except that, as the donor organic semiconductor material, PCPDTBT was replaced by $Si(OSiHex_3)_2Nc$ (manufactured by Merck/Sigma-Aldrich) represented by Structural formula (4) below. Incidentally, the obtained blend film was found to have a thickness of about 180 nm.

(4)

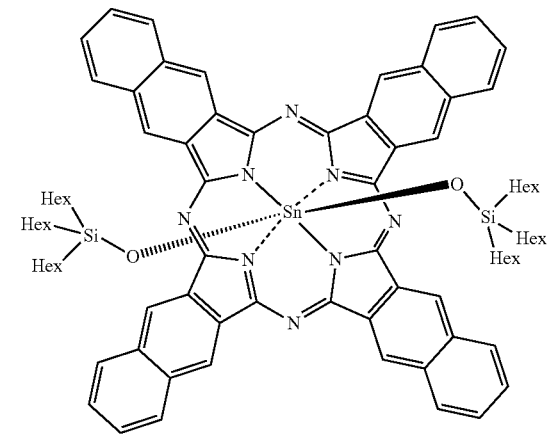

Figure 8:
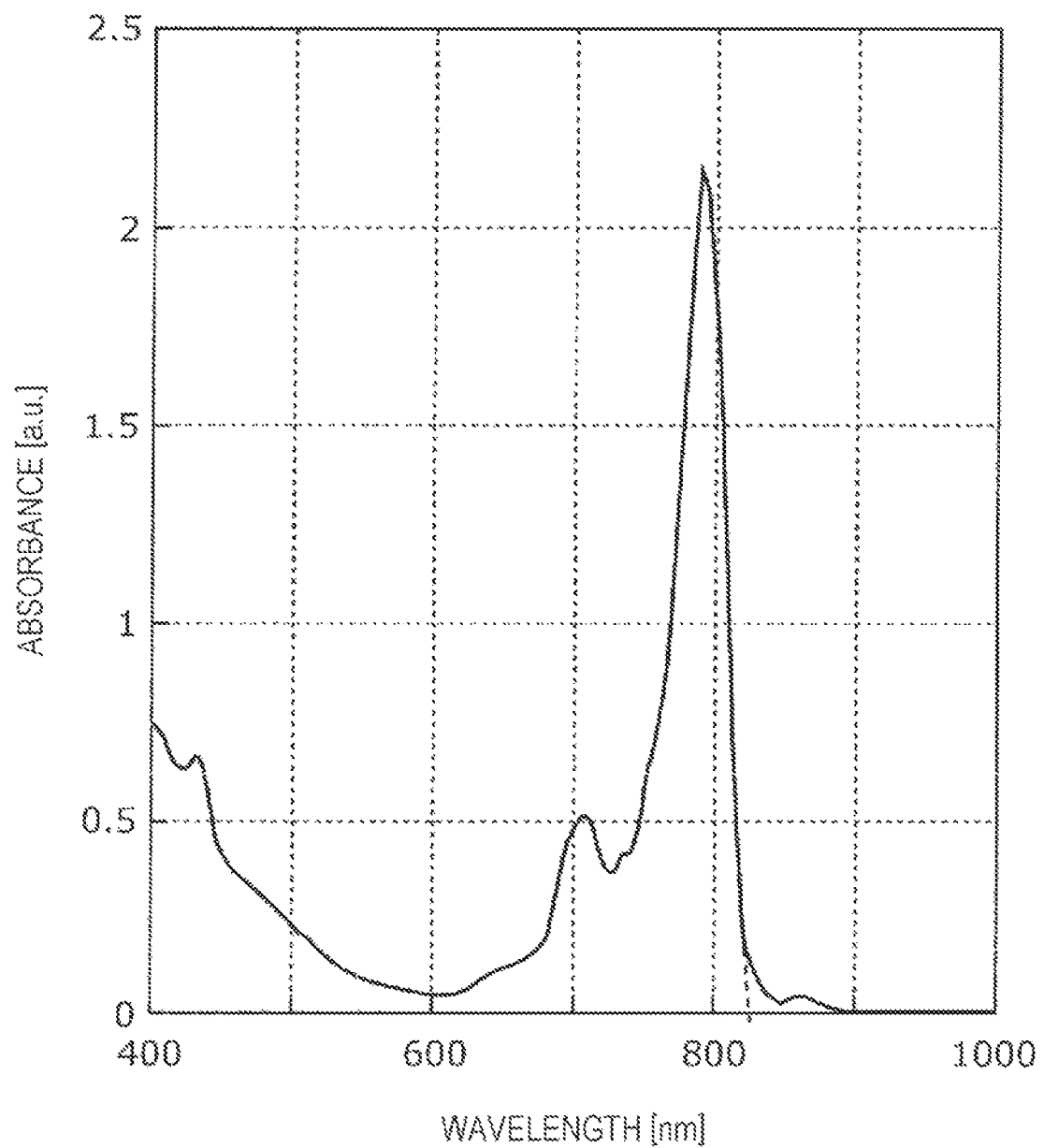
FIG. 8 illustrates the absorption spectrum of the photoelectric conversion layer of Comparative Example 1.

The obtained absorption spectrum is shown in FIG. 8. The photoelectric conversion layer of Comparative Example 1 was found to have a maximum-absorption peak at about 790 nm. The measurement results of the absorption edge and the ionization potential are described in Table 1.

TABLE 1

| Material | | Absorption edge [nm] | Ionization potential [eV] |
| --- | --- | --- | --- |
| Example 1 | PCPDTBT:PCBM | 866 | 5.1 |
| Example 2 | $(OBu)_8Si(OPOPh-3,5bisCF_3)_2Nc$:PCBM | 1010 | 5.3 |
| Comparative Example 1 | $Si(OSiHex_3)_2Nc$:PCBM | 822 | 5.4 |

As described in Table 1, the photoelectric conversion layers of Example 1, Example 2, and Comparative Example 1 all have absorption edges in the near-infrared light region, and hence have been demonstrated to have spectral sensitivity in the near-infrared light region. The ionization potentials of the photoelectric conversion layers of Example 1, Example 2, and Comparative Example 1 were respectively found to be 5.1 eV, 5.3 eV, and 5.4 eV.

Measurement of Ionization Potentials and Electron Affinities of Acceptor Organic Semiconductor Material and Hole-Blocking Layers Hereinafter, with reference to Example 3, Example 4, Comparative Example 2, Comparative Example 3, and Comparative Example 4, the ionization potentials and the electron affinities of an acceptor organic semiconductor material of a photoelectric conversion layer and a hole-blocking layer according to the present disclosure will be specifically described. The ionization potentials and electron affinities of the acceptor organic semiconductor material and the hole-blocking layer were measured in a state of a single film.

Example 3

Method for Preparation of Sample

As the support substrate, a quartz glass plate (quartz substrate) having a thickness of 0.7 mm was employed; onto the substrate, as the acceptor organic semiconductor material of the photoelectric conversion layer, a solution (solvent: chlorobenzene, 10 m/ml) of phenyl $C_{61}$ butyric acid methyl ester (PCBM: ([6,6]-Phenyl-C61-Butyric Acid Methyl Ester, manufactured by Frontier Carbon Corporation), Structural formula (2) above) was applied by a spin-coating process, to form an organic-material thin film. Incidentally, the obtained organic-material thin film was found to have a thickness of about 30 nm.

Measurement of Absorption Edge

For the organic-material thin film formed on the quartz substrate, the same procedures as in Example 1 were performed to measure the absorption spectrum using a spectrophotometer (manufactured by Hitachi High-Technologies Corporation, U4100), and the absorption edge was estimated.

Measurement of Ionization Potential

The same organic-material thin film as in <Method for preparation of sample> above was formed on an ITO substrate, and measured in terms of ionization potential. The ionization potential was measured in the same manner as in Example 1 except that the organic-material thin film was used. The obtained result of ionization potential is described in Table 2.

Measurement of Electron Affinity

From the result of absorption edge obtained in <Measurement of absorption edge> above, an optical band gap was calculated as the difference between the ionization potential and the electron affinity. From the result of ionization potential obtained in <Measurement of ionization potential> above, the optical band gap was subtracted to estimate the electron affinity. The obtained result of electron affinity is described in Table 2.

Example 4

The same procedures as in Example 3 were performed except that, as the material, PCBM was replaced by a material for a hole-blocking layer that was ClAlPc (manufactured by Merck/Sigma-Aldrich) represented by Structural formula (5) below to form a film by a vacuum deposition process, to perform the preparation of a sample, the measurement of an absorption edge, the measurement of ionization potential, and the measurement of electron affinity. Incidentally, the obtained organic-material thin film was found to have a thickness of about 30 nm.

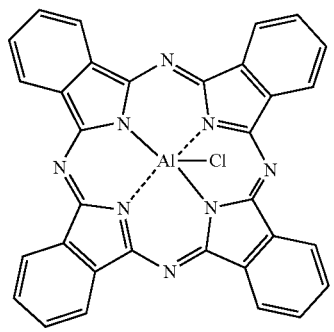

(5)

The obtained results of ionization potential and electron affinity are described in Table 2.

Comparative Example 2

The same procedures as in Example 4 were performed except that, as the material, ClAlPc was replaced by a material for a hole-blocking layer that was PTCBI (manufactured by Tokyo Chemical Industry Co., Ltd.) represented by Structural formula (6) below, to perform the preparation of a sample, the measurement of an absorption edge, the measurement of ionization potential, and the measurement of electron affinity. Incidentally, the obtained organic-material thin film was found to have a thickness of about 30 nm.

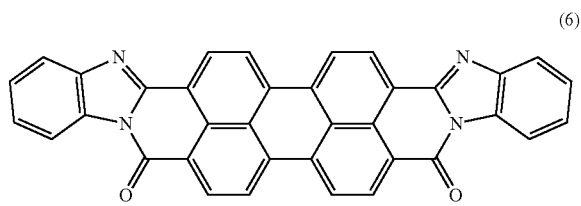 [SMILES: O=c1c2ccc3c4ccc5c(=O)n6c7ccccc7nc6c6ccc(c7ccc(c2c37)c2nc3ccccc3n12)c4c56]

(6)

The obtained results of ionization potential and electron affinity are described in Table 2.

Comparative Example 3

The same procedures as in Example 4 were performed except that, as the material, ClAlPc was replaced by a material for a hole-blocking layer that was PTCDI (manufactured by Tokyo Chemical Industry Co., Ltd.) represented by Structural formula (7) below, to perform the preparation of a sample, the measurement of an absorption edge, the measurement of ionization potential, and the measurement of electron affinity. Incidentally, the obtained organic-material thin film was found to have a thickness of about 25 nm.

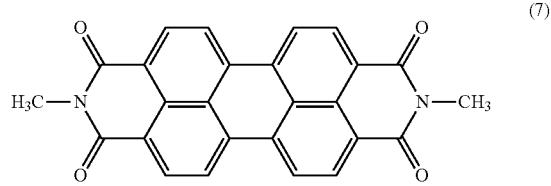

(7)

The obtained results of ionization potential and electron affinity are described in Table 2.

Comparative Example 4

The same procedures as in Example 4 were performed except that, as the material, ClAlPc was replaced by a material for a hole-blocking layer that was C60 (fullerene, manufactured by Frontier Carbon Corporation) represented by Structural formula (8) below, to perform the preparation of a sample, the measurement of an absorption edge, the measurement of ionization potential, and the measurement of electron affinity. Incidentally, the obtained organic-material thin film was found to have a thickness of about 50 nm.

(8)

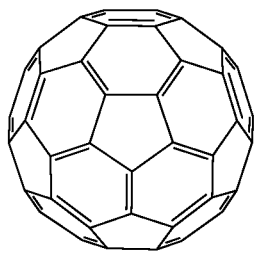

The obtained results of ionization potential and electron affinity are described in Table 2.

TABLE 2

|  | Material | Ionization potential [eV] | Electron affinity [eV] |
| --- | --- | --- | --- |
| Example 3 | PCBM | 6.2 | 4.3 |
| Example 4 | ClAlPc | 5.5 | 4.0 |
| Comparative Example 2 | PTCBI | 5.9 | 4.4 |
| Comparative Example 3 | PTCDI | 6.4 | 4.5 |
| Comparative Example 4 | C60 | 6.4 | 4.7 |

As described in Table 2, the following have been demonstrated: the hole-blocking layer formed of ClAlPc in Example 4 has a lower electron affinity than the acceptor organic semiconductor material being PCBM for the photoelectric conversion layer in Example 3; and the hole-blocking layers of Comparative Examples 2 to 4 have a higher electron affinity than PCBM.

Near-Infrared Photoelectric Conversion Device

Hereinafter, with reference to Example 5, Example 6, and Comparative Example 5 to Comparative Example 12, near-infrared photoelectric conversion devices according to the present disclosure will be more specifically described.

Example 5

Production of Photoelectric Conversion Device

The following procedures were performed to produce a photoelectric-conversion-device sample. The production of the sample was performed throughout under a nitrogen atmosphere. First, a glass substrate having a thickness of 0.7 mm and having, on one of the main surfaces, an ITO film having a thickness of 150 nm and serving as the lower electrode was prepared. Onto the lower electrode, a VNPB (N4,N4'-di(Naphthalen-1-yl)-N4,N4'-bis(4-vinylphenyl)biphenyl-4,4'-diamine, manufactured by LUMTEC) solution (solvent: o-xylene, 10 mg/ml) was applied by a spin-coating process, to form an electron-blocking layer. After this film formation, the substrate was heated on a hot plate at 200° C. for 50 minutes to cause crosslinking to achieve insolubility. Subsequently, as the photoelectric conversion layer, a blend film was formed by, as in Example 1, applying a mixed solution of PCPDTBT and PCBM (in a weight ratio of 1:3, solvent: chlorobenzene, 30 mg/ml) by a spin-coating process. Incidentally, the obtained blend film was found to have a thickness of about 150 nm.

Furthermore, on the substrate on which the blend film was formed, a vacuum deposition process was performed through a metal shadow mask to form, as the hole-blocking layer, a film of ClAlPc, which is the same material as in Example 4, so as to have a thickness of 30 nm.

Subsequently, on the formed hole-blocking layer, an Al electrode was formed as the upper electrode so as to have a thickness of 80 nm, to obtain a photoelectric conversion device. The Al electrode was formed at a degree of vacuum of less than or equal to $5.0 \times 10^{-4}$ Pa at a deposition rate of 1 Å/s.

The photoelectric conversion layer in Example 5 is formed of the same material as in the photoelectric conversion layer in Example 1; thus, the result of ionization potential measured in Example 1 is described in Table 3. In addition, the hole-blocking layer in Example 5 is formed of the same material as in the hole-blocking layer in Example 4; thus, the result of electron affinity measured in Example 4 is described in Table 3.

Production of Comparative Photoelectric Conversion Device

The same procedures as in <Production of photoelectric conversion device> above were performed except that the hole-blocking layer was not formed, to produce a photoelectric conversion device as a comparative photoelectric conversion device.

Measurement of Dark Current

The obtained photoelectric conversion device and comparative photoelectric conversion device were measured in terms of dark current. The measurement was performed with a B1500A semiconductor device parameter analyzer (manufactured by Keysight Technologies). More specifically, the dark current of the photoelectric conversion device was measured under a voltage condition of 2.5 V within a glove box having a nitrogen atmosphere. From the obtained results, the following formula was used, to calculate a relative dark current, which is a ratio of the dark current value of the photoelectric conversion device using the hole-blocking layer to the dark current value of the comparative photoelectric conversion device not using the hole-blocking layer.

Relative dark current=Dark current value of photoelectric conversion device/Dark current value of comparative photoelectric conversion device The obtained result of relative dark current is described in Table 3.

Measurement of Spectral Sensitivity

Figure 9:
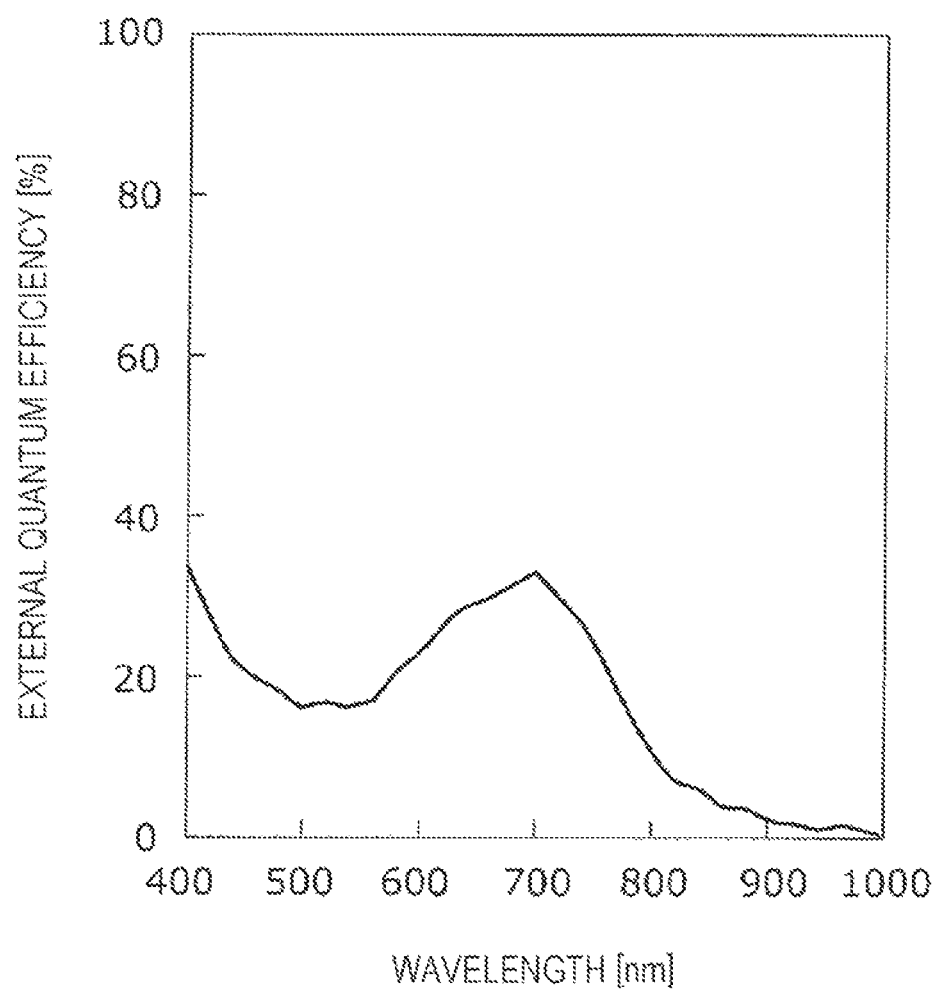
FIG. 9 illustrates the spectral-sensitivity spectrum of the photoelectric conversion device of Example 5.

The obtained photoelectric conversion device was measured in terms of spectral sensitivity. Specifically, into a measurement jig having a glove box for sealing under a nitrogen atmosphere, the photoelectric conversion device was placed; a spectral sensitivity measurement system designed to cover also long wavelengths (manufactured by Bunkoukeiki Co., Ltd., CEP-25RR) was used under a voltage condition of 2.5 V, to measure spectral sensitivity. The obtained measurement result of spectral sensitivity is shown in FIG. 9. In the spectral-sensitivity spectrum, the abrupt increase on the longer-wavelength side is at about 900 nm; thus, the photoelectric conversion device in Example 5 has spectral sensitivity in the near-infrared light region. The external quantum efficiency at the wavelength of the obtained maximum peak in the near-infrared light region is described in Table 3.

Comparative Example 5

The same procedures as in Example 5 were performed except that, for the hole-blocking layer, ClAlPc was replaced by PTCBI, which is the same material as in Comparative Example 2, to perform the production of a photoelectric conversion device, the production of a comparative photoelectric conversion device, the measurement of dark current, and the measurement of spectral sensitivity. The obtained ionization potential of the photoelectric conversion layer, electron affinity of the hole-blocking layer, relative dark current, and external quantum efficiency are described in Table 3.

Comparative Example 6

The same procedures as in Example 5 were performed except that, for the hole-blocking layer, ClAlPc was replaced by PTCDI, which is the same material as in Comparative Example 3, to perform the production of a photoelectric conversion device, the production of a comparative photoelectric conversion device, the measurement of dark current, and the measurement of spectral sensitivity. The obtained ionization potential of the photoelectric conversion layer, electron affinity of the hole-blocking layer, relative dark current, and external quantum efficiency are described in Table 3.

Comparative Example 7

The same procedures as in Example 5 were performed except that, for the hole-blocking layer, ClAlPc was replaced by C60, which is the same material as in Comparative Example 4, to perform the production of a photoelectric conversion device, the production of a comparative photoelectric conversion device, the measurement of dark current, and the measurement of spectral sensitivity. The obtained ionization potential of the photoelectric conversion layer, electron affinity of the hole-blocking layer, relative dark current, and external quantum efficiency are described in Table 3.

Example 6

Figure 10:
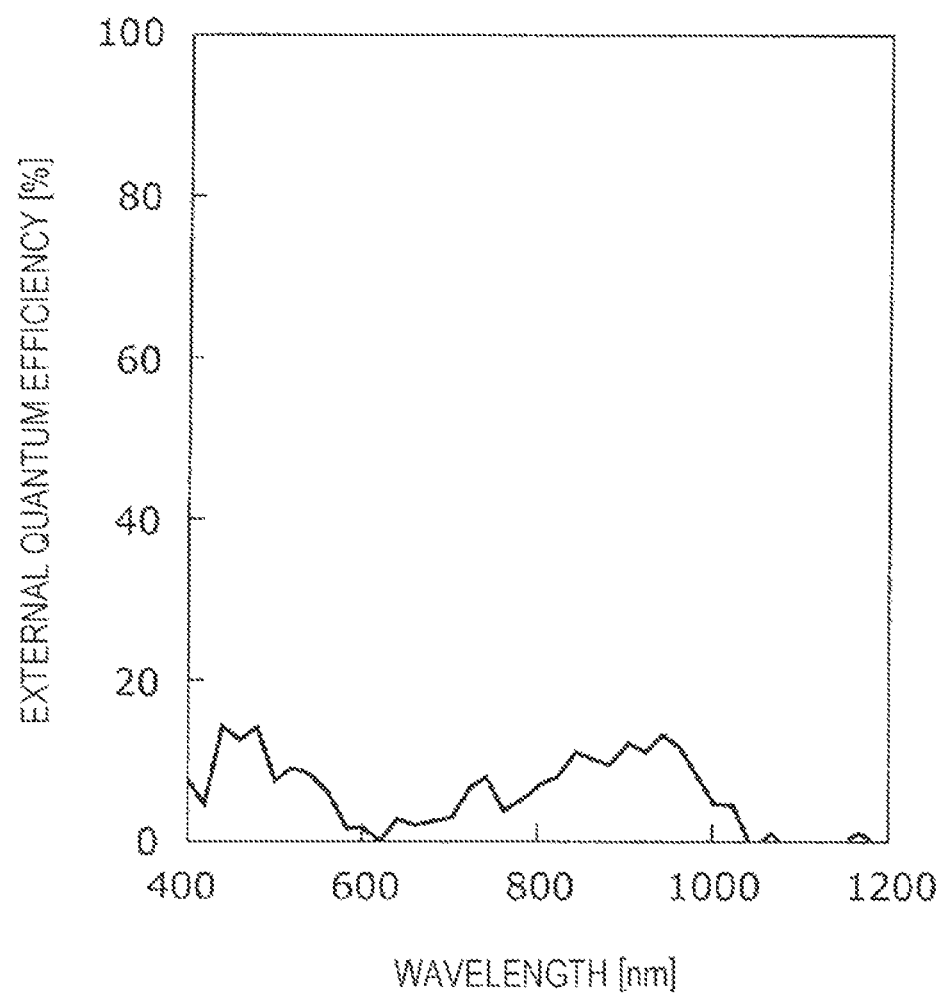
FIG. 10 illustrates the spectral-sensitivity spectrum of the photoelectric conversion device of Example 6.

The same procedures as in Example 5 were performed except that, for the photoelectric conversion layer, the mixed solution of PCPDTBT and PCBM was replaced by the mixed solution of $(OBu)_8Si(OPOPh-3,5bisCF_3)_2Nc$ and PCBM, which is the same material as in Example 2, to perform the production of a photoelectric conversion device, the production of a comparative photoelectric conversion device, the measurement of dark current, and the measurement of spectral sensitivity. The obtained ionization potential of the photoelectric conversion layer, electron affinity of the hole-blocking layer, relative dark current, and external quantum efficiency are described in Table 3. The obtained measurement result of spectral sensitivity is shown in FIG. 10. In the spectral-sensitivity spectrum, the abrupt increase on the longer-wavelength side is at about 1000 nm; thus, the photoelectric conversion device in Example 6 has spectral sensitivity in the near-infrared light region.

Comparative Example 8

The same procedures as in Example 6 were performed except that, for the hole-blocking layer, ClAlPc was replaced by C60, which is the same material as in Comparative Example 4, to perform the production of a photoelectric conversion device, the production of a comparative photoelectric conversion device, the measurement of dark current, and the measurement of spectral sensitivity. The obtained ionization potential of the photoelectric conversion layer, electron affinity of the hole-blocking layer, relative dark current, and external quantum efficiency are described in Table 3.

Comparative Example 9

Figure 11:
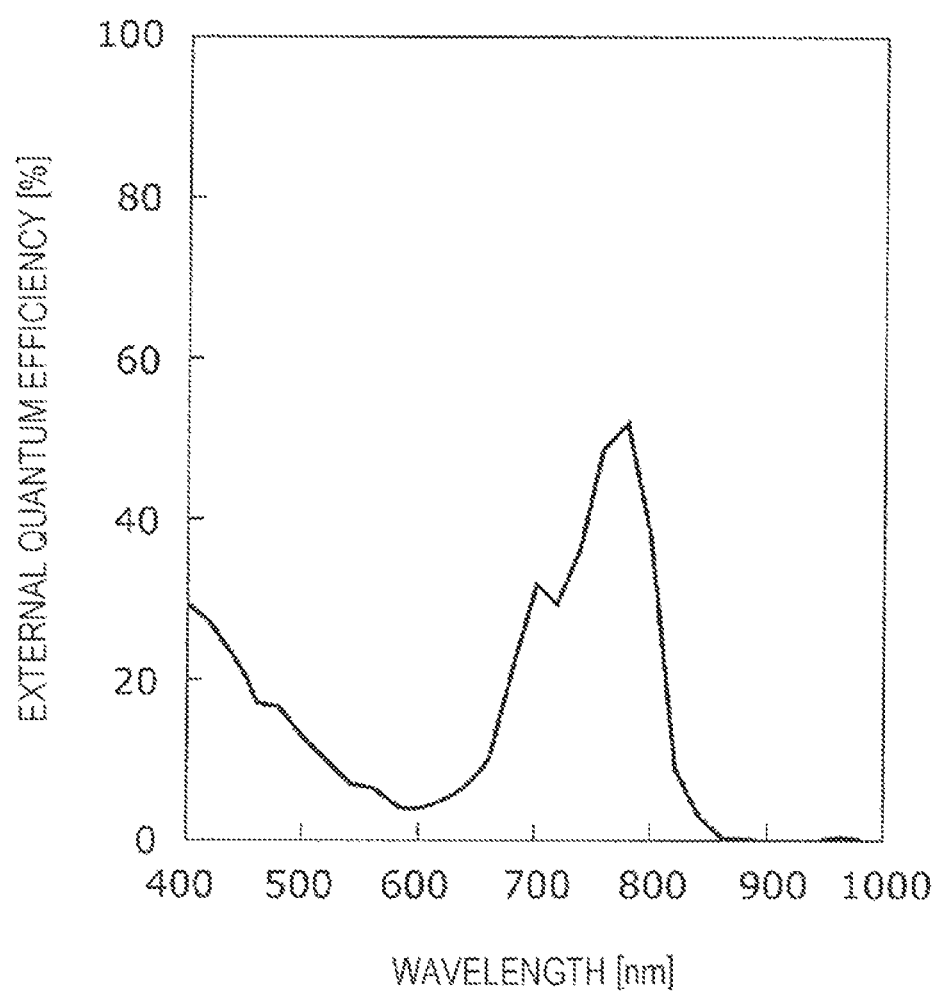
FIG. 11 illustrates the spectral-sensitivity spectrum of the photoelectric conversion device of Comparative Example 9.

The same procedures as in Example 5 were performed except that, for the photoelectric conversion layer, the mixed solution of PCPDTBT and PCBM was replaced by the mixed solution of $Si(OSiHex_3)_2Nc$ and PCBM, which is the same material as in Comparative Example 1, to perform the production of a photoelectric conversion device, the production of a comparative photoelectric conversion device, the measurement of dark current, and the measurement of spectral sensitivity. The obtained ionization potential of the photoelectric conversion layer, electron affinity of the hole-blocking layer, relative dark current, and external quantum efficiency are described in Table 3. The obtained measurement result of spectral sensitivity is shown in FIG. 11. In the spectral-sensitivity spectrum, the abrupt increase on the longer-wavelength side is at about 850 nm; thus, the photoelectric conversion device in Comparative Example 9 has spectral sensitivity in the near-infrared light region.

Comparative Example 10

The same procedures as in Comparative Example 9 were performed except that, for the hole-blocking layer, ClAlPc was replaced by PTCBI, which is the same material as in Comparative Example 2, to perform the production of a photoelectric conversion device, the production of a comparative photoelectric conversion device, the measurement of dark current, and the measurement of spectral sensitivity. The obtained ionization potential of the photoelectric conversion layer, electron affinity of the hole-blocking layer, relative dark current, and external quantum efficiency are described in Table 3.

Comparative Example 11

The same procedures as in Comparative Example 9 were performed except that, for the hole-blocking layer, ClAlPc was replaced by PTCDI, which is the same material as in Comparative Example 3, to perform the production of a photoelectric conversion device, the production of a comparative photoelectric conversion device, the measurement of dark current, and the measurement of spectral sensitivity. The obtained ionization potential of the photoelectric conversion layer, electron affinity of the hole-blocking layer, relative dark current, and external quantum efficiency are described in Table 3.

Comparative Example 12

The same procedures as in Comparative Example 9 were performed except that, for the hole-blocking layer, ClAlPc was replaced by C60, which is the same material as in Comparative Example 4, to perform the production of a photoelectric conversion device, the production of a comparative photoelectric conversion device, the measurement of dark current, and the measurement of spectral sensitivity. The obtained ionization potential of the photoelectric conversion layer, electron affinity of the hole-blocking layer, relative dark current, and external quantum efficiency are described in Table 3.

TABLE 3

| | Photoelectric conversion layer | | Hole-blocking layer | | Photoelectric conversion device | |
|---|---|---|---|---|---|---|
| | Material | Ionization potential [eV] | Material | Electron affinity [eV] | Relative dark current | Quantum efficiency [%] |
| Example 5 | PCPDTBT:PCBM | 5.1 | ClAlP$_C$ | 4.0 | 0.004 | 33 |
| Comparative Example 5 | PCPDTBT:PCBM | 5.1 | PTCBI | 4.4 | 0.031 | 32 |
| Comparative Example 6 | PCPDTBT:PCBM | 5.1 | PTCDI | 4.5 | 0.073 | 28 |
| Comparative Example 7 | PCPDTBT:PCBM | 5.1 | C60 | 4.7 | 0.068 | 27 |
| Example 6 | (OBu)$_8$Si(OPOPh-3,5bisCF$_3$)$_2$Nc:PCBM | 5.3 | ClAlP$_C$ | 4.0 | 0.024 | 13.1 |
| Comparative Example 8 | (OBu)$_8$Si(OPOPh-3,5bisCF$_3$)$_2$Nc:PCBM | 5.3 | C60 | 4.7 | 1.7 | 10.8 |
| Comparative Example 9 | Si(OSiHex$_3$)$_2$Nc:PCBM | 5.4 | ClAlP$_C$ | 4.0 | 1.1 | 52 |
| Comparative Example 10 | Si(OSiHex$_3$)$_2$Nc:PCBM | 5.4 | PTCBI | 4.4 | 0.98 | 53 |
| Comparative Example 11 | Si(OSiHex$_3$)$_2$Nc:PCBM | 5.4 | PTCDI | 4.5 | 0.95 | 53 |
| Comparative Example 12 | Si(OSiHex$_3$)$_2$Nc:PCBM | 5.4 | C60 | 4.7 | 1.2 | 54 |

As described in Table 3, the following have been demonstrated: in each of Example 5, Example 6, Comparative Examples 5 to 7, and Comparative Examples 9 to 12, the relative dark current was less than about 1, and the introduction of the hole-blocking layer does not change or lowers the dark current value. In Comparative Example 8, the relative dark current was 1.7, and introduction of the hole-blocking layer caused the increase in the dark current value.

Furthermore, the results of Comparative Examples 9 to 12 have demonstrated that, in the cases of using, for the photoelectric conversion layer, Si(OSiHex$_3$)$_2$Nc:PCBM having an ionization potential of 5.4 eV, the relative dark current does not depend on the material of the hole-blocking layer and is about 1 for any of the materials. In other words, the following has been demonstrated: in photoelectric conversion devices including a photoelectric conversion layer having an ionization potential of 5.4 eV, introduction of the hole-blocking layers used in Comparative Examples 9 to 12 does not provide the effect of reducing the dark current.

By contrast, comparison among Example 5 and Comparative Examples 5 to 7, and comparison between Example 6 and Comparative Example 8 have revealed the following: among these cases of using (OBu)$_8$Si(OPOPh-3,5bisCF$_3$)$_2$Nc:PCBM (5.3 eV) or PCPDTBT:PCBM (5.1 eV) forming a photoelectric conversion layer having an ionization potential of lower than or equal to 5.3 eV, compared with the cases where the electron affinity of the hole-blocking layer is higher than the electron affinity (4.3 eV, refer to Example 3 in Table 2) of PCBM serving as the acceptor organic semiconductor material of the photoelectric conversion layer (Comparative Examples 5 to 8), in the cases where the former is lower than the latter (Example 5 and Example 6), the relative dark current is low. In other words, the following has been demonstrated: in a photoelectric conversion device including a photoelectric conversion layer having an ionization potential of lower than or equal to 5.3 eV, a hole-blocking layer having an electron affinity lower than the electron affinity of the acceptor organic semiconductor material of the photoelectric conversion layer is introduced, to thereby enhance the effect of reducing the dark current.

The photoelectric conversion materials and the photoelectric conversion device according to the present disclosure are applicable to, for example, image sensors, and are applicable to, for example, image sensors that have high optical absorbance in the near-infrared light region.

What is claimed is:
1. An imaging apparatus comprising:
   a semiconductor substrate;
   a first electrode;
   a second electrode;
   a photoelectric conversion layer disposed between the first electrode and the second electrode, and including a donor organic semiconductor material and an acceptor organic semiconductor material;
   a charge accumulation node positioned within the semiconductor substrate and electrically connected to the second electrode; and
   a first blocking layer disposed between the first electrode and the photoelectric conversion layer, the first blocking layer being a hole blocking layer,
   wherein the photoelectric conversion layer has an ionization potential of lower than or equal to 5.3 eV,
   the first blocking layer has an electron affinity lower than an electron affinity of the acceptor organic semiconductor material included in the photoelectric conversion layer, and
   the imaging apparatus has spectral sensitivity in a near-infrared light region having wavelengths of greater than or equal to 650 nm and less than or equal to 3000 nm.
2. The imaging apparatus according to claim 1, wherein an absorption wavelength of the photoelectric conversion layer has a local maximum in the near-infrared light region.
3. The imaging apparatus according to claim 1, wherein the photoelectric conversion layer includes, as the acceptor organic semiconductor material, at least one selected from the group consisting of fullerene and a fullerene derivative.

4. The imaging apparatus according to claim 3, wherein the acceptor organic semiconductor material includes a soluble fullerene derivative.

5. The imaging apparatus according to claim 1, wherein the acceptor organic semiconductor material is the same as a material of the first blocking layer.

6. The imaging apparatus according to claim 1, wherein the electron affinity of the first blocking layer is lower than a work function of the first electrode.

7. The imaging apparatus according to claim 1, wherein the first blocking layer has an ionization potential lower than an ionization potential of the acceptor organic semiconductor material included in the photoelectric conversion layer.

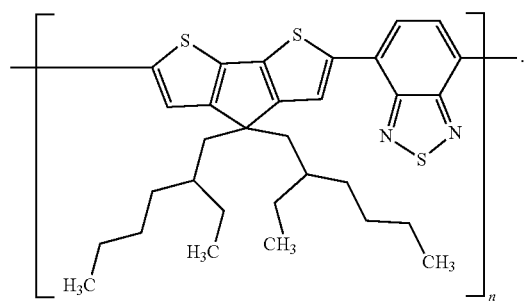

15. The imaging apparatus according to claim 1, wherein the donor organic semiconductor material includes (OBu)$_8$Si(OPOPh-3,5bisCF$_3$)$_2$Nc, represented by:

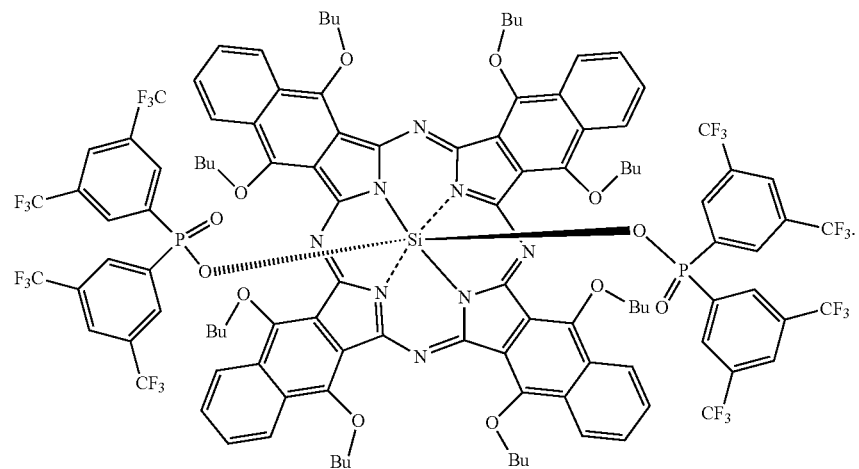

8. The imaging apparatus according to claim 1, further comprising a second blocking layer disposed between the second electrode and the photoelectric conversion layer.

9. The imaging apparatus according to claim 8, wherein the second blocking layer has an electron affinity lower than an electron affinity of the donor organic semiconductor material included in the photoelectric conversion layer.

10. The imaging apparatus according to claim 8, wherein the second blocking layer has an ionization potential higher than an ionization potential of the donor organic semiconductor material included in the photoelectric conversion layer.

11. The imaging apparatus according to claim 8, wherein the second blocking layer has an electron affinity lower than a work function of the second electrode.

12. The imaging apparatus according to claim 1, wherein a thickness of the first blocking layer is in a range from 2 nm to 50 nm.

13. The imaging apparatus according to claim 1, wherein the first blocking layer includes chloroaluminum phthalocyanine (ClAlPc).

14. The imaging apparatus according to claim 1, wherein the donor organic semiconductor material includes poly[2,6-(4,4-bis-(2-ethylhexyl)-4H-cyclopenta[2,1-b;3,4-b']dithiophene)-alt-4,7-(2,1,3-benzothiadiazole)] (PCPDTBT), represented by:

16. The imaging apparatus according to claim 1, wherein the acceptor organic semiconductor material includes [6,6]-phenyl-C61-butyric acid methyl ester, represented by:

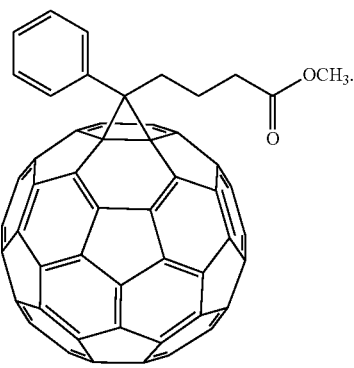 [SMILES: COC(=O)CCCC1(c2ccccc2)C23C4=CC=C5c6ccc7c8ccc9c%10ccc%11c%12ccc4c4c2c2c%13c(c6c7c6c8c9c7c%10c%11c(c4%12)c2c7c%136)C513]

17. The imaging apparatus according to claim 1, wherein the first blocking layer has an ionization potential greater than an ionization potential of the donner organic semiconductor material included in the photoelectric conversion layer.

18. The imaging apparatus according to claim 1, wherein the first blocking layer has an ionization potential greater than a work function of the first electrode.

* * * * *